US007301755B2

(12) United States Patent
Rodriguez et al.

(10) Patent No.: US 7,301,755 B2
(45) Date of Patent: Nov. 27, 2007

(54) ARCHITECTURE FOR POWER MODULES SUCH AS POWER INVERTERS

(75) Inventors: Pablo Rodriguez, Dearborn, MI (US);
Douglas K. Maly, Jefferson, MA (US);
Ajay V. Patwardhan, Canton, MI (US);
Kanghua Chen, Canton, MI (US);
Sayeed Ahmed, Canton, MI (US);
Gerardo Jimenez, Southgate, MI (US);
Fred Flett, Bloomfield, MI (US)

(73) Assignee: Siemens VDO Automotive Corporation, Auburn Hills ( * ) Notice: Subject to any disclaimer, the term of this patent is extended or adjusted under 35 U.S.C. 154(b) by 583 days.

(21) Appl. No.: 11/010,561

(22) Filed: Dec. 13, 2004

(65) Prior Publication Data

US 2005/0162875 A1    Jul. 28, 2005

Related U.S. Application Data

(60) Provisional application No. 60/530,443, filed on Dec. 17, 2003.

(51) Int. Cl.
*H02H 7/122* (2006.01)
*H05K 7/20* (2006.01)

(52) U.S. Cl. ............. 361/676; 361/704; 361/746; 361/775; 361/807; 165/80.2; 165/80.3; 165/185; 174/16.3; 174/52.2; 174/252; 174/254; 363/37; 363/143; 363/144; 363/321

(58) Field of Classification Search ........ 361/702–710, 361/717–719, 721–723, 801, 807, 820, 728, 361/746, 809, 812, 720; 257/678, 687, 690, 257/696, 706–726, 691–963, 762–764, 770; 174/16.3, 52.1, 52.4, 15.1; 363/40, 55, 58, 363/132, 141, 131, 144–147, 112, 149
See application file for complete search history.

(56) References Cited

U.S. PATENT DOCUMENTS

| | | | |
|---|---|---|---|
| 4,772,999 A | 9/1988 | Fiorina et al. | 363/141 |
| 5,350,894 A | 9/1994 | Allison | 200/549 |
| 5,519,252 A * | 5/1996 | Soyano et al. | 257/690 |
| 5,748,456 A * | 5/1998 | Bayerer | 361/820 |
| 6,181,590 B1 | 1/2001 | Yamane et al. | 363/132 |
| 6,327,165 B1 * | 12/2001 | Yamane et al. | 363/132 |
| 6,434,008 B1 * | 8/2002 | Yamada et al. | 361/728 |
| 6,584,001 B2 * | 6/2003 | Ruthlein et al. | 363/144 |
| 6,603,672 B1 | 8/2003 | Deng et al. | 363/37 |

(Continued)

FOREIGN PATENT DOCUMENTS

JP        2001238460 A  *  8/2001

OTHER PUBLICATIONS

U.S. Appl. No. 10/738,926, filed Dec. 16, 2003, Maly et al.
U.S. Appl. No. 60/233,992, filed Sep. 20, 2000, Parkhill et al.
U.S. Appl. No. 60/233,993, filed Sep. 20, 2000, Parkhill et al.
U.S. Appl. No. 60/233,994, filed Sep. 20, 2000, Parkhill et al.
U.S. Appl. No. 60/233,995, filed Sep. 20, 2000, Parkhill et al.
U.S. Appl. No. 60/233,996, filed Sep. 20, 2000, Parkhill et al.
U.S. Appl. No. 60/471,387, filed May 16, 2003, Flett et al.

*Primary Examiner*—Michael Datskovskiy

(57) ABSTRACT

Power converters such as power modules configured as inverters employ modularized approaches. In some aspects, semiconductor devices are thermally coupled directly to thermally conductive substrates without intervening dielectric or insulative structures. Additionally, or alternatively, semiconductor devices are thermally coupled to thermally conductive substrates with relatively large surface areas before heat transferred from the semiconductor devices encounters a dielectric or electrically insulating structure with correspondingly high thermal impedance.

20 Claims, 22 Drawing Sheets

U.S. PATENT DOCUMENTS

| | | | |
|---|---|---|---|
| 6,636,429 B2 | 10/2003 | Maly et al. | 361/818 |
| 6,793,502 B2 * | 9/2004 | Parkhill et al. | 439/66 |
| 6,843,335 B2 * | 1/2005 | Shirakawa et al. | 180/65.1 |
| 6,845,017 B2 * | 1/2005 | Ahmed et al. | 361/775 |
| 6,861,764 B2 * | 3/2005 | Sato et al. | 257/797 |
| 6,882,850 B2 * | 4/2005 | McConnell et al. | 455/453 |
| 6,888,729 B2 | 5/2005 | Maekawa et al. | 363/56.02 |
| 6,900,986 B2 * | 5/2005 | Kimoto et al. | 361/704 |
| 6,906,404 B2 * | 6/2005 | Maly et al. | 257/678 |
| 6,987,670 B2 * | 1/2006 | Ahmed et al. | 361/699 |
| 7,012,810 B2 * | 3/2006 | Parkhill et al. | 361/775 |
| 7,034,345 B2 * | 4/2006 | Chang et al. | 257/177 |
| 7,122,890 B2 * | 10/2006 | Grant | 257/698 |
| 7,180,763 B2 * | 2/2007 | Patwardhan et al. | 363/144 |
| 7,193,860 B2 * | 3/2007 | Parkhill et al. | 361/775 |
| 7,227,259 B2 * | 6/2007 | Heilbronner et al. | 257/724 |
| 2002/0034088 A1 | 3/2002 | Parkhill et al. | 363/144 |
| 2002/0167828 A1 | 11/2002 | Parkhill et al. | 363/144 |
| 2003/0175576 A1 | 9/2003 | Ohtani et al. | 429/38 |
| 2005/0152100 A1 | 7/2005 | Rodriguez et al. | 361/605 |
| 2005/0152101 A1 | 7/2005 | Rodriguez et al. | 361/605 |
| 2006/0007721 A1 | 1/2006 | Rodriguez et al. | 363/146 |

* cited by examiner

ARCHITECTURE FOR POWER MODULES SUCH AS POWER INVERTERS

BACKGROUND OF THE INVENTION

1. Field of the Invention

This disclosure is generally related to electrical power systems, and more specifically to power converter architectures such as power modules suitable for rectifying, inverting and/or converting electrical power between power sources and loads.

2. Description of the Related Art

Power converters are used to transform and/or condition power from one or more power sources to supply to one or more loads. An inverter is commonly used to transform direct current (DC) to alternating current (AC), for use in supplying power to an AC load. A rectifier is commonly used to transform AC to DC. A DC/DC converter is commonly used to step up or step down a DC voltage. An appropriately configured and operated power converter may perform any one or more of these functions. As used herein and in the claims which follow, the term "converter" applies to all converters whether inverters, rectifiers and/or DC/DC converters.

A large variety of applications require power transformation and/or conditioning. For example, a DC power source such as a fuel cell system, battery and/or ultracapacitor may produce DC power, which must be inverted to supply power to an AC load such as a three phase AC motor in an electric or hybrid vehicle. A photovoltaic array may produce DC power that must be inverted to supply or export AC power to a power grid of a utility. An AC power source such as a power grid or micro-turbine may need to be rectified to supply power to a DC load such as a tool, machine or appliance or the DC input of an inverter. A high voltage DC source may need to be stepped down to supply a low voltage load, or a low voltage DC source may need to be stepped up to supply a high voltage load. Other applications will become apparent to those skilled in the art based on the teachings herein.

Power modules are typically self-contained units that include a converter to transform and/or condition power from one or more power sources for supplying power to one or more loads. Power modules typically employ transistors, diodes and other components that generate substantial heat during operation, particularly when operating at high loads. Excessive heat can cause the components to under perform or even fail if not adequately addressed. Conventional power module structures employ various electrically insulating layers for electrically insulating the various components from one another and from the exterior of the power module. For example, components are typically mounted on direct bond copper (DBC) or direct bond aluminum (DBA) substrates, which comprise a ceramic substrate with metal foil fused on both sides. These electrically insulating layers also tend to be thermally insulating, significantly decreasing the ability to transfer heat away from the electronics.

Many applications for power converters are cost and/or size sensitive. These applications will employ other alternatives if sufficiently inexpensive converters are not available in packages with a sufficiently small footprint. Thus, it is desirable to reduce the cost and footprint of power converters, without reducing the rated power. It is further desirable to enhance the heat transfer characteristics in a power module, which may improve reliability and which may lower costs by reducing the amount of silicon required to accommodate the thermal characteristics of the power module. Further, it is desirable to be able produce a variety of power modules from relatively few common components, to cost effectively accommodate customers' varying requirements while incurring a minimal level in design costs and maintaining a minimal level of inventory.

BRIEF SUMMARY OF THE INVENTION

Power converters such as power modules configured as inverters employ modularized approaches. In some aspects, semiconductor devices are thermally coupled directly to thermally conductive substrates without intervening dielectric or insulative structures. Additionally, or alternatively, semiconductor devices are thermally coupled to thermally conductive substrates with relatively large surface areas, effectively spreading the heat transferred from the semiconductor devices before the heat encounters a dielectric or electrically insulating structure with correspondingly high thermal impedance.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well-known structures associated with power converters, such as control systems including microprocessors and drive circuitry have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the claimed invention.

Figure 1:
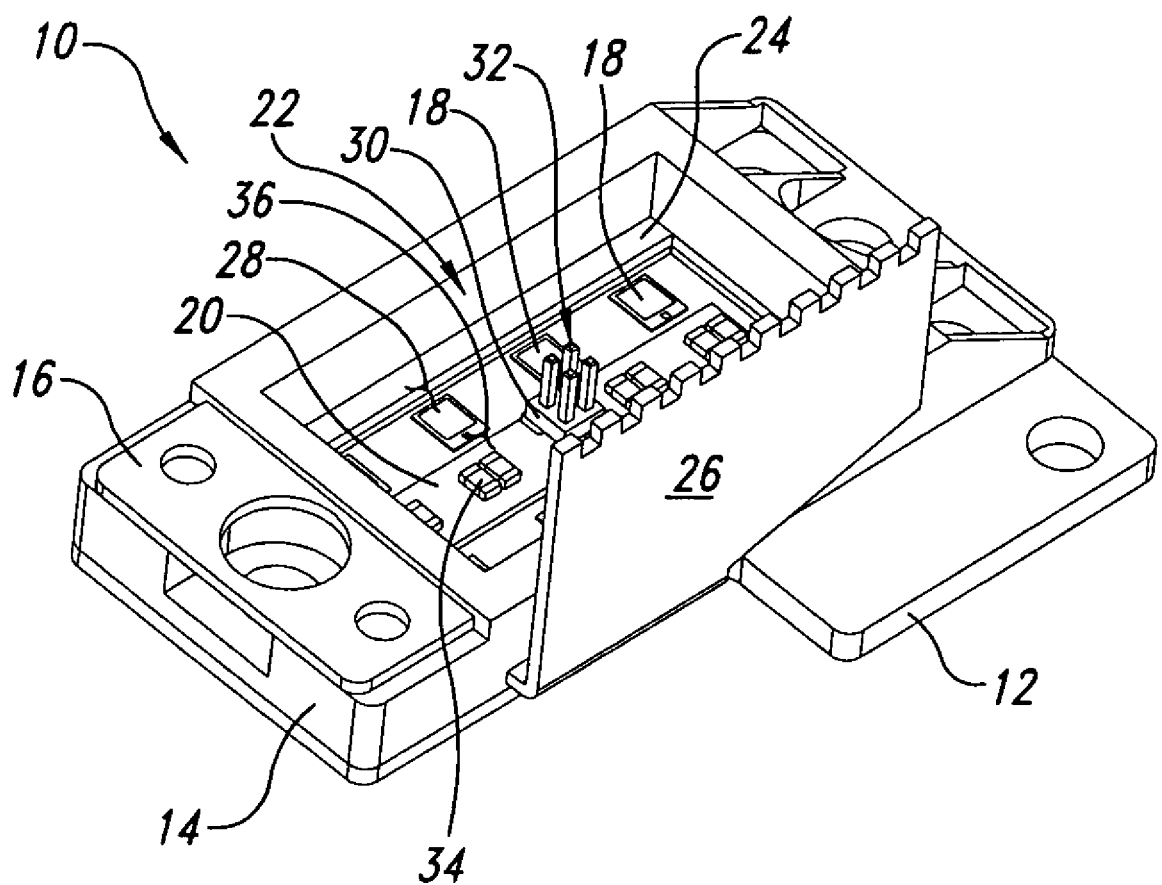
FIG. 1 is a top, front, right isometric view of a low-side switch module for use in a power module according to one illustrated embodiment.
Figure 2:
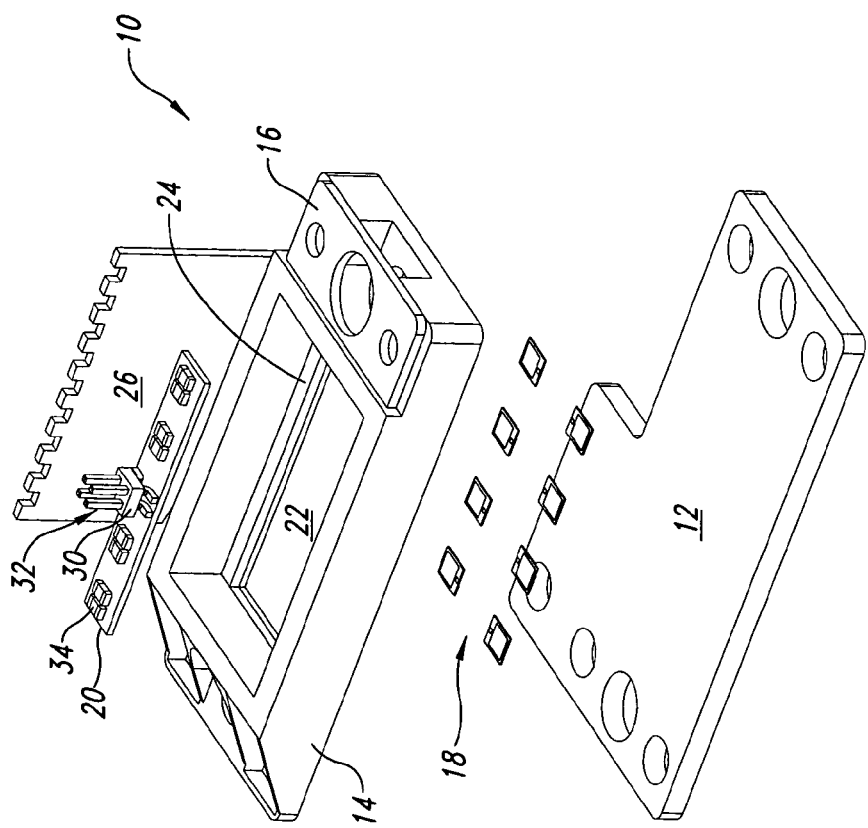
FIG. 2 is an exploded top, left, front isometric view of the low-side switch module of FIG. 1.

FIGS. 1 and 2 show a low-side switch module 10 suitable, for example, for use in a low-side of a modularized converter circuit of a power module, such as a DC→AC inverter. The low-side switch module 10 comprises a conductive base plate 12, an electrically insulative housing 14, a conductive member 16, a number of semiconductor devices 18 and a control resistor board 20.

The base plate 12 is preferably a solid slab of conductive material, such as copper or aluminum, without any electrically or thermally insulative material. The housing 14 is an insulative material such as a plastic, epoxy and/or epoxy impregnated fiber glass. The housing 14 may be formed using a variety of techniques, for example, via injection molding. The housing 14 may be mechanically coupled to the base plate 12 using fasteners received through holes or apertures provided in the housing 14 and base plate 12, and/or adhesive. The housing 14 forms an opening 22, exposing a portion of the base plate 12.

The conductive member 16 may be insert molded in the housing 14 to secure the conductive member 16 therein, and to electrically insulate the conductive member 16 from the base plate 12. A perimeter portion 24 of the conductive member 16 extends from at least a portion of a perimeter of the opening 22 of the housing 14, exposing a portion of the conductive member 16 within the opening 22 of the housing 14 for making electrical connections thereto as discussed in detail below. An upright portion 26 of the conductive member 16 extends from the housing 14 at an approximately right angle to the base plate 12.

The semiconductor devices 18 are carried by the base plate 12, and positioned thereon so as to be exposed by the opening 22 of the housing 14. The semiconductor devices 18 may take the form of transistors and/or diodes, such as metal oxide semiconductor field effect transistors (MOSFETs) and/or insulated gate bipolar transistors (IGBTs). Such transistors are commercially available, individually, or in sets of two or six transistor switches. The transistors typically include the anti-parallel diodes which may or may not be an inherent portion of the fabricated semiconductor transistor structure. The transistors are essentially three element devices, comprising a pair of active elements (e.g., source/emitter, drain/collector) and a control element, (e.g., gate, base). While only one of the terms (e.g., source rather than drain or source/drain) are occasionally used henceforth, those of skill in the art will recognize that such is for convenience only, and such use does not restrict the teachings or claims to MOSFETs, but are also applicable to other types of transistors, for example, IGBTs.

The semiconductor devices 18 are preferably unpackaged or bare dice. One active terminal (e.g., drain, collector) of each of the semiconductor devices 18 may be electrically and thermally coupled to the base plate 12 by surface mounting. The other active terminal (e.g., source, emitter) of each of the semiconductor devices 18 may be electrically coupled to the perimeter portion 24 of the conductive member 16 via one or more wire bonds 28 (only one illustrated for clarity of presentation). Thus, the semiconductor devices 18 are electrically coupled in parallel, and may be operated in parallel, receiving the same switching signals at approximately the same time, as discussed below.

The control resistor board 20 includes a terminal block 30 with terminals 32 for receiving control signals (e.g., gate drive signals) from a controller (e.g., gate drive board) (not shown). The control resistor board 20 also includes a plurality of resistors 34 and conductive traces (not shown). The control resistor board 20 is electrically coupled to the control terminals (e.g., gates, bases) of the semiconductor devices 18 via wire bonds 36 (only one shown).

Figure 3:
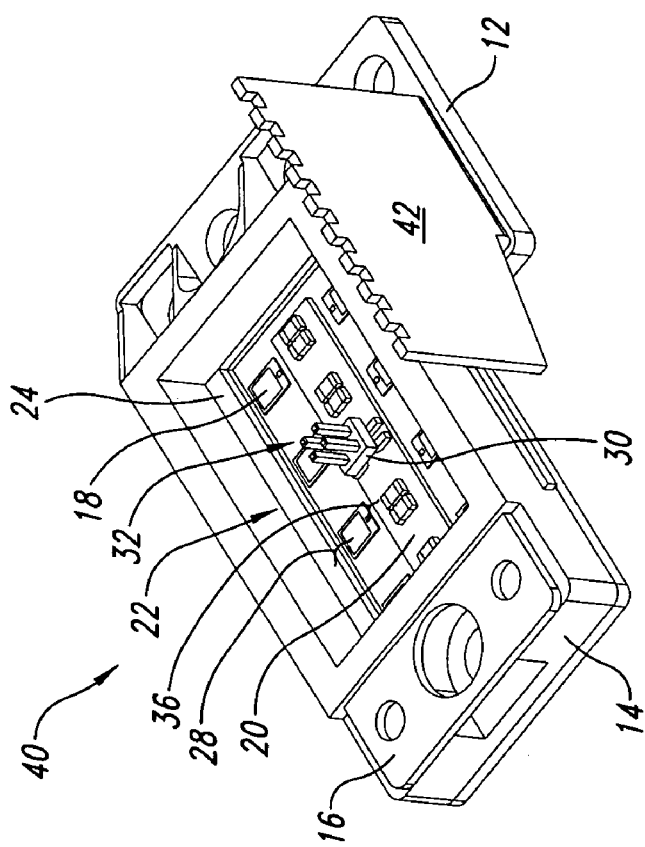
FIG. 3 is a top, front, right isometric view of a high-side switch module for use in a power module according to one illustrated embodiment.

FIG. 3 shows a high-side switch module 40 according to one illustrated embodiment. The high-side switch module 40 is substantially similar to the previously described low-side switch module 10, thus common structures are identified by the same reference numbers. Only significant differences in structure and operation are described below.

In particular, the high-side switch module 40 includes an upright portion 42 that extends from, and is electrically coupled to the base plate 12. This contrasts with the upright portion 26 of the low-side switch module 10, which extends from and is electrically coupled to the conductive member 16.

Figure 4:
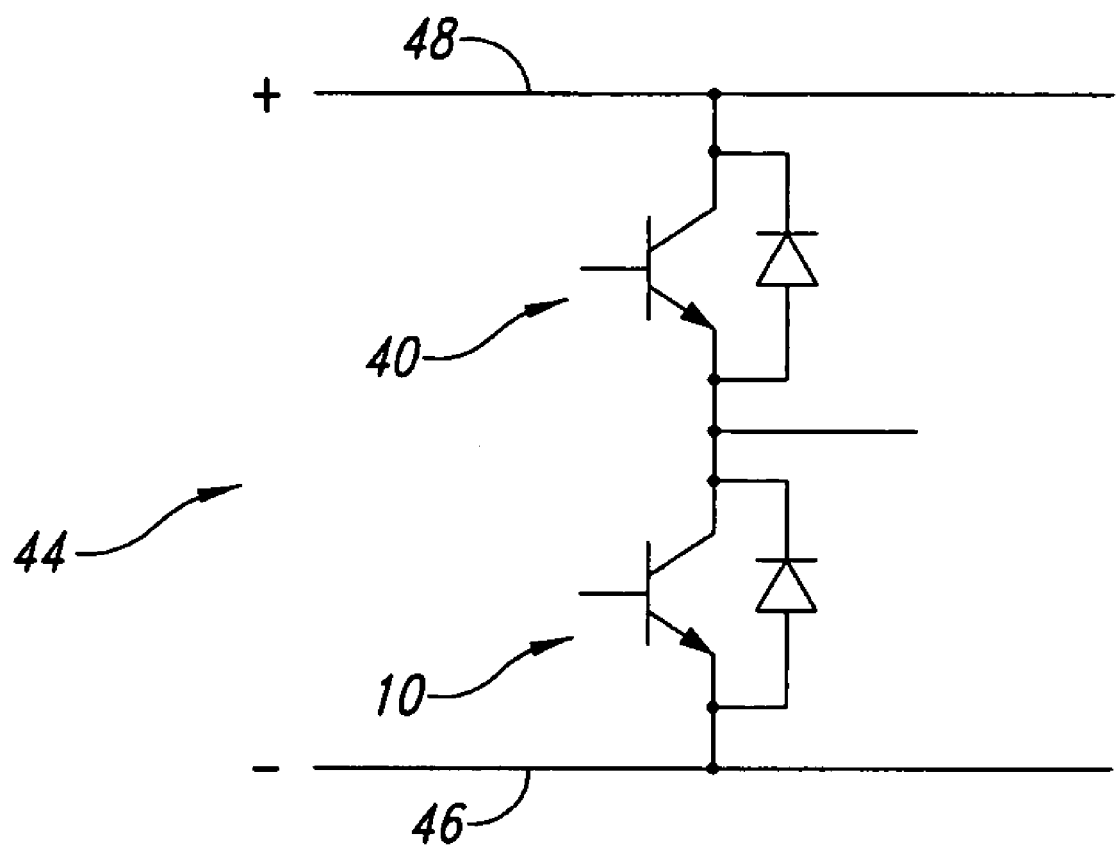
FIG. 4 is an electrical schematic of a converter circuit in the form of an inverter comprising the low-side and side-side switch modules of FIGS. 1-3 according to one illustrated embodiment.

FIG. 4 shows a half-bridge circuit 44 that may be formed by electrically coupling the low-side switch module 10 and high-side switch module 40, according to one illustrated embodiment. The semiconductor devices 18 of the switch modules 10, 40 forming the half-bridge circuit 44 may be operated to, for example, invert DC power from a DC source such as a fuel cell stack, battery and/or ultracapacitor to AC power to drive an AC load such as a thee phase electric motor.

In particular, the conductive member 16, or upright portion 26 thereof, of the low-side switch module 10 (FIG. 1) is electrically coupled to a negative side of a DC supply, for example, via a negative rail or plate 46 of a DC bus. The base plate 12, or upright portion 42 thereof, of the high-side switch module 40 (FIG. 3) is electrically coupled to a positive side of the DC supply, for example, via a positive rail or plate 48 of the DC bus. An AC output appears on the base plate 12 of the low-side switch module 10 and on the conductive member 16 of the high-side switch module 40, which may be electrically shorted together.

Figure 5:
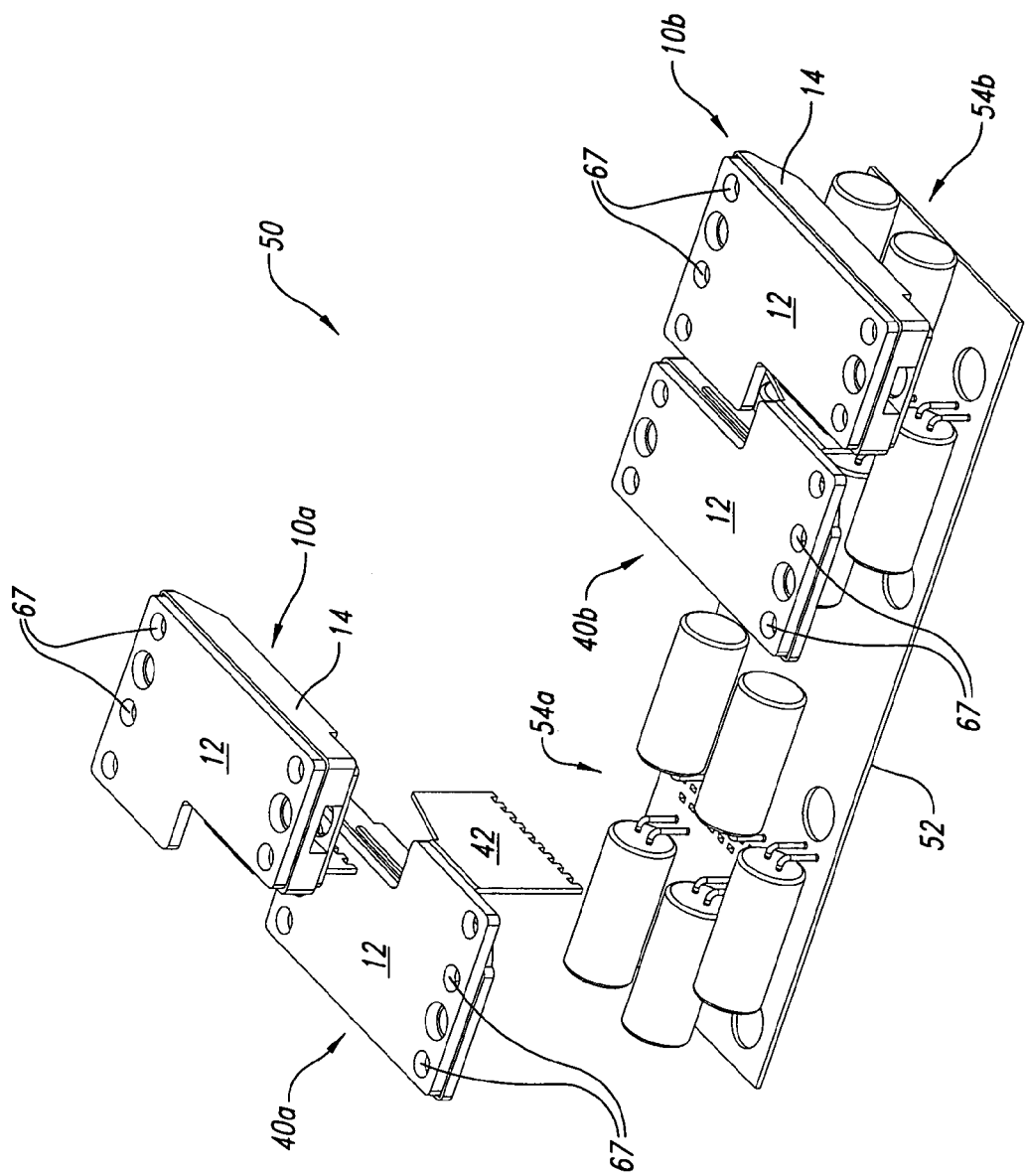
FIG. 5 is a partially exploded bottom, rear, left isometric view of a half-bridge inverter module formed from two pairs of the low- and high-side switches of FIGS. 1-3 according to one illustrated embodiment.
Figure 6:
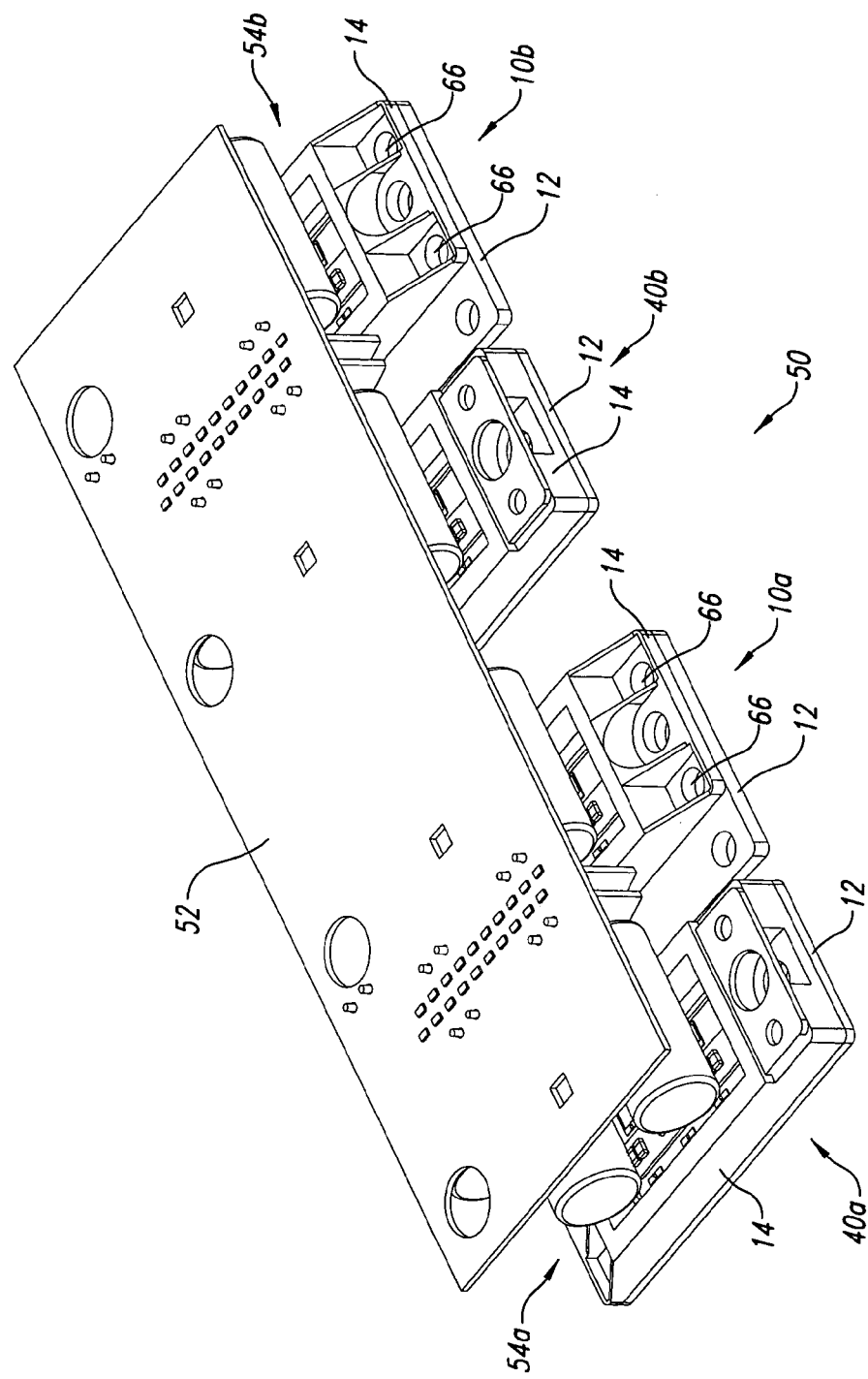
FIG. 6 is a top, front, right isometric view of the half-bridge inverter module of FIG. 5.
Figure 7:
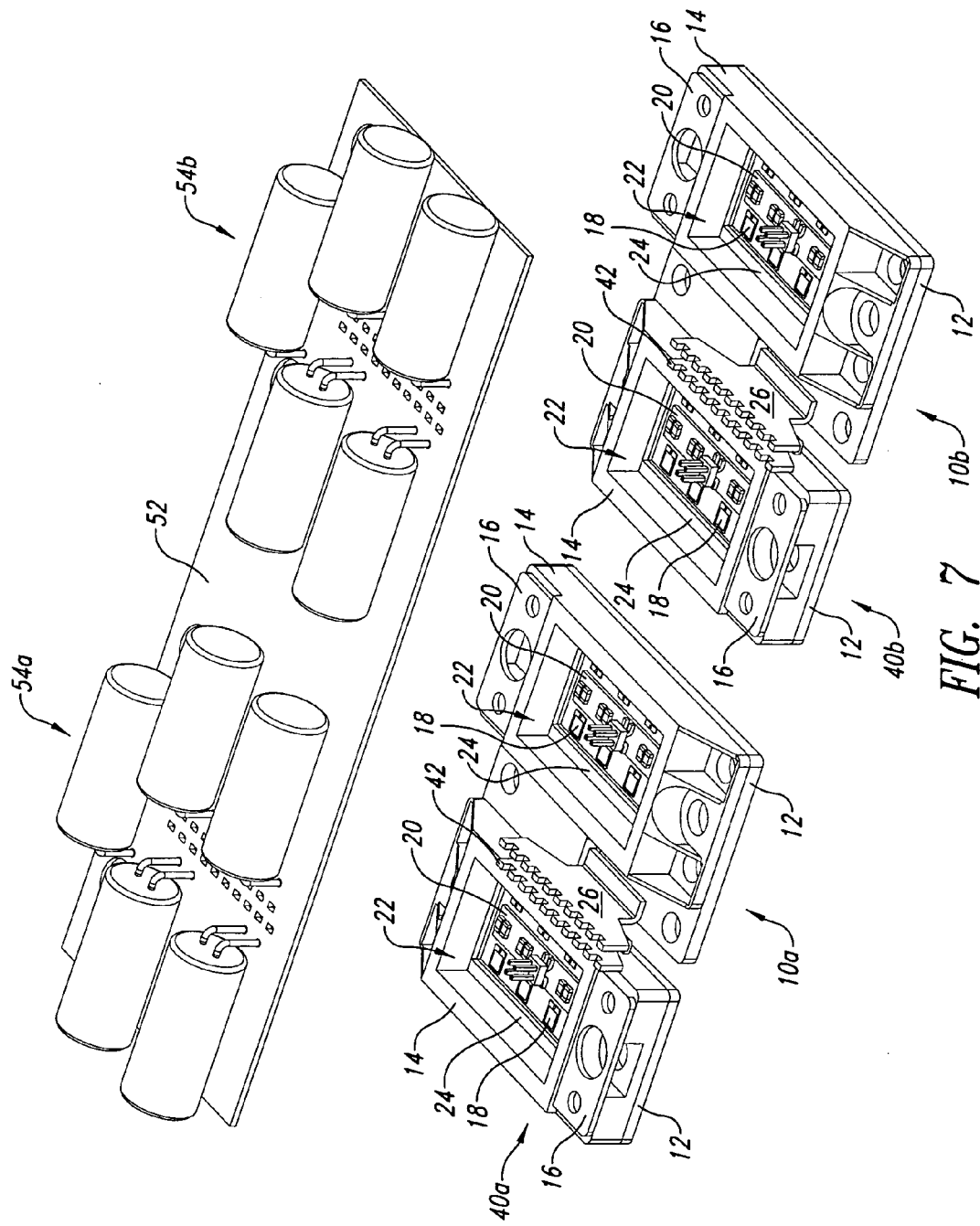
FIG. 7 is a partially exploded bottom, front, left isometric view of the half-bridge inverter module of FIGS. 5 and 6 with a circuit board flipped over to better illustrate first and second sets of capacitors carried by the circuit board.

FIGS. 5-7 show two pairs of low- and high-side switch modules 10, 40 coupled to form a half-bridge inverter module 50. In particular, a circuit board 52 carries a first pair of low- and high-side switches 10a, 40a mounted proximate each other and electrically coupled together as a half-bridge circuit 44 (FIG. 4), and a second pair of low-side and high-side switches 10b, 40b also mounted proximate each other and electrically coupled together as a half-bridge circuit 44 (FIG. 4). In this embodiment, the terminals formed at the distal end of the upright portions 26, 42 are received in through-holes formed in the circuit board 52 and manually soldered thereto. The circuit board 52 is typically a lamination of electrically conductive and electrically insulative layers, which may carry a number of electrically conductive traces. Often, the circuit board 52 will include at least one heavy copper layer in order to carry the high currents typically encountered in most power inverter applications.

The circuit board 52 may carry a first number of bus capacitors 54a electrically coupled to the first pair of switch modules 10a, 40a and a second set of bus capacitors 54b electrically coupled to the second pair of switch modules 10b, 40b. The bus capacitors 54a, 54b may reduce or eliminate voltage overshoot. The half-bridge inverter module 50 may also include one or more bridges, shown and discussed in detail below with reference to FIG. 8.

The base plates 12 may be thermally coupled to one or more pluralities of heat exchange members, with or without, any intervening thermally insulative structures. Such as structure is taught in commonly assigned U.S. application Ser. No. 10/738,926, filed Dec. 16, 2003 and entitled "POWER MODULE WITH HEAT EXCHANGE" (Express Mail No. EV336618969US), and incorporated herein in its entirety. Thermally coupling without any intervening thermally insulative structures has distinct advantages for maximizing the effectiveness of heat removal, and thereby improving reliability and possibly allowing the use of less silicon (e.g., fewer semiconductor devices to handle a given power) and hence reducing the cost of the units. In some embodiments, the switch modules 10, 40 may be enclosed in a module housing to provide electrical and/or environmental isolation. While the module housing may primarily be electrically insulative, and hence thermally insulative, the illustrated embodiment advantageously increases the surface area of the heat sink (e.g., base plates 12) before heat transported from the semiconductor devices 18 encounters a first interface (e.g., connection between base plates 12 and the module housing) with an electrically and/or thermally insulative layer or structure (e.g., module housing).

Figure 8:
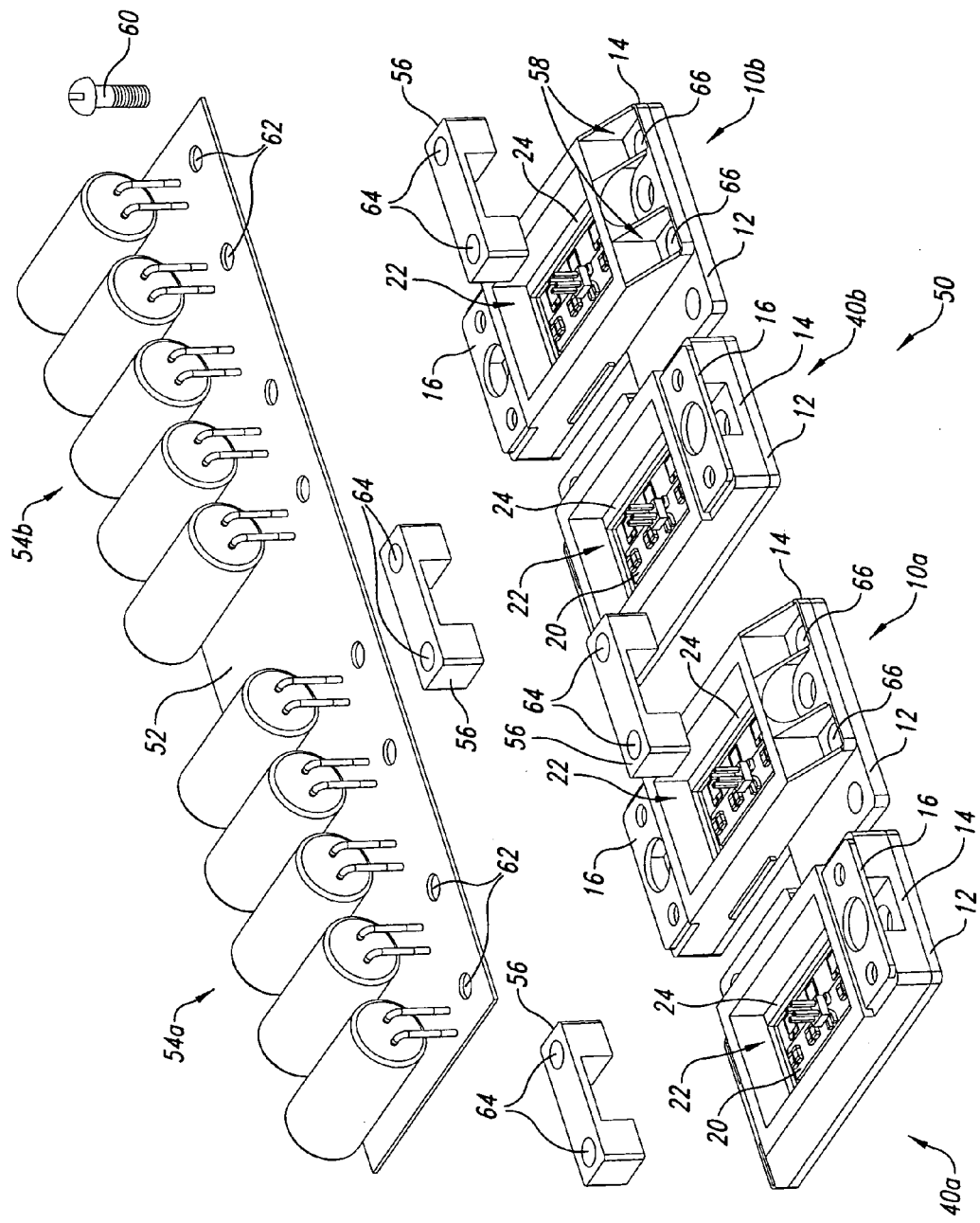
FIG. 8 is a partially exploded bottom, front, right isometric view of a half-bridge inverter module formed from two pairs of the low- and high-side switches of FIGS. 1-3, employing fasteners and conductive bridges rather than upright portions for making electrical connections according to another illustrated embodiment, with the circuit board flipped over to better illustrate first and second sets of capacitors carried by the circuit board.

FIG. 8 shows another embodiment of the half-bridge inverter module 50, employing fasteners such as screwdown terminals for making physical and/or electrical connections between the switch modules 10, 40 and the circuit board 52, rather than soldering as illustrated in FIGS. 5-7. This permits the use of wave soldering with the switch modules 10, 40, since the circuit board 52 can now be easily attached to the switch modules 10, 40 using the fasteners after wave soldering. This also allows the configuration to be decided upon immediately before assembly, allowing last minute customization.

In particular, the low- and high-side switch modules 10, 40 omit the upright structures 26, 42, respectively, of the previous embodiments. A respective conductive bridge 56 electrically couples the base plate 12 of each of the switch modules 10a, 10b, 40a, 40b to the circuit board 52. The conductive bridge 56 may be generally U-shaped, with the legs of the U-shape sized and spaced to be accommodated by a coupling structure 58 formed in the housing 14. The conductive bridge 56 may take a variety of other shapes, for example, trapezoidal, where suitable for the particular shape of the housing 14 and base plate 12. Fasteners 60, for example screws or bolts, may be received through holes 62, 64, 66, 67 formed in the circuit board 52, conductive bridges 56, housings 14 and base plates 12, respectively, for securing the physical and/or electrical connections therebetween.

Figure 9:
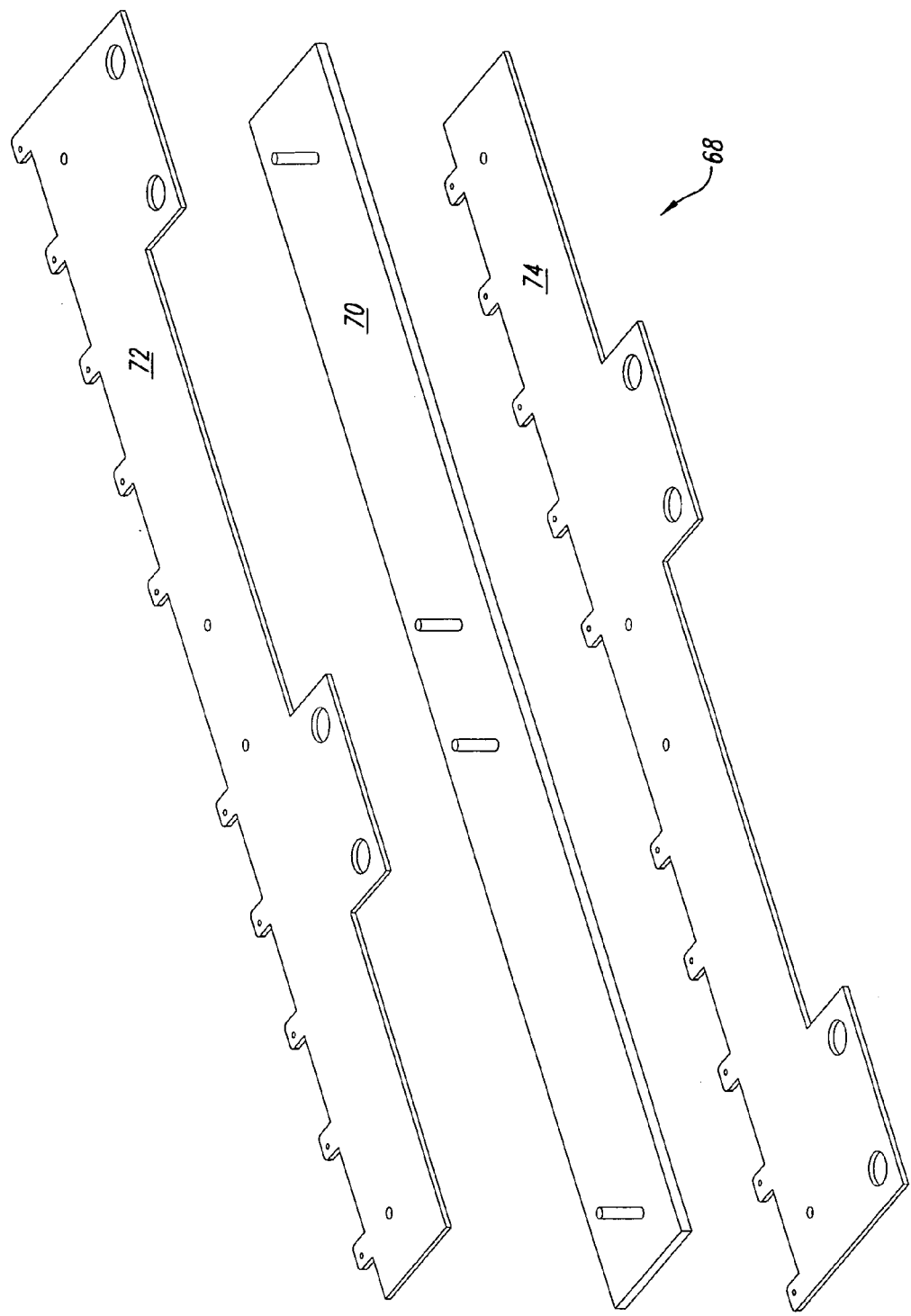
FIG. 9 is an exploded top, front, right isometric view of a circuit board for use in the half-bridge inverter modules of FIGS. 5-8, according to another illustrated embodiment.

FIG. 9 shows a circuit board 68 according to another illustrated embodiment, suitable for use with the half-bridge inverter module 50 of FIG. 8. For example, the circuit board 68 may be suitable for carrying the bus capacitors 54a, 54b, and electrically coupling the bus capacitors 54a, 54b and the low- and high-side switch modules 10a, 10b, 40a, 40b. In particular, the circuit board 68 comprises an electrically insulating layer 70 laminated between two conductive layers 72, 74. The conductive layers 72, 74 may be precut to a desired pattern. The conductive layers 72, 74 may be relatively thin, for example made of copper or aluminum foil. The circuit board 68 may replace the heavy copper circuit board 52 discussed above in reference to FIGS. 5-8, significantly reducing material costs and/or inductance.

Figure 10:
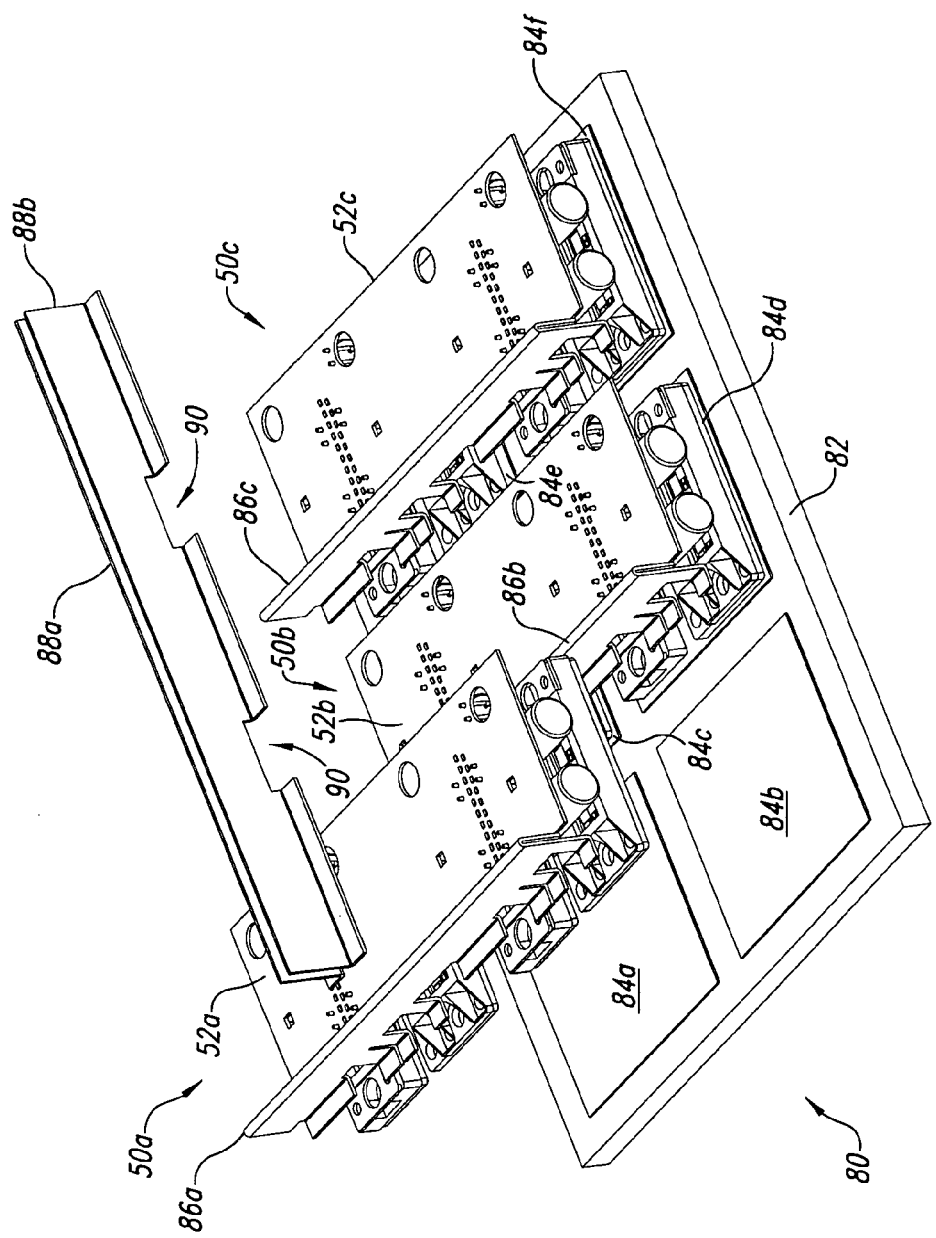
FIG. 10 is a partially exploded top, front, left isometric view of a three-phase inverter formed from three of the half-bridge inverter modules of FIGS. 5-7, according to one illustrated embodiment.
Figure 11:
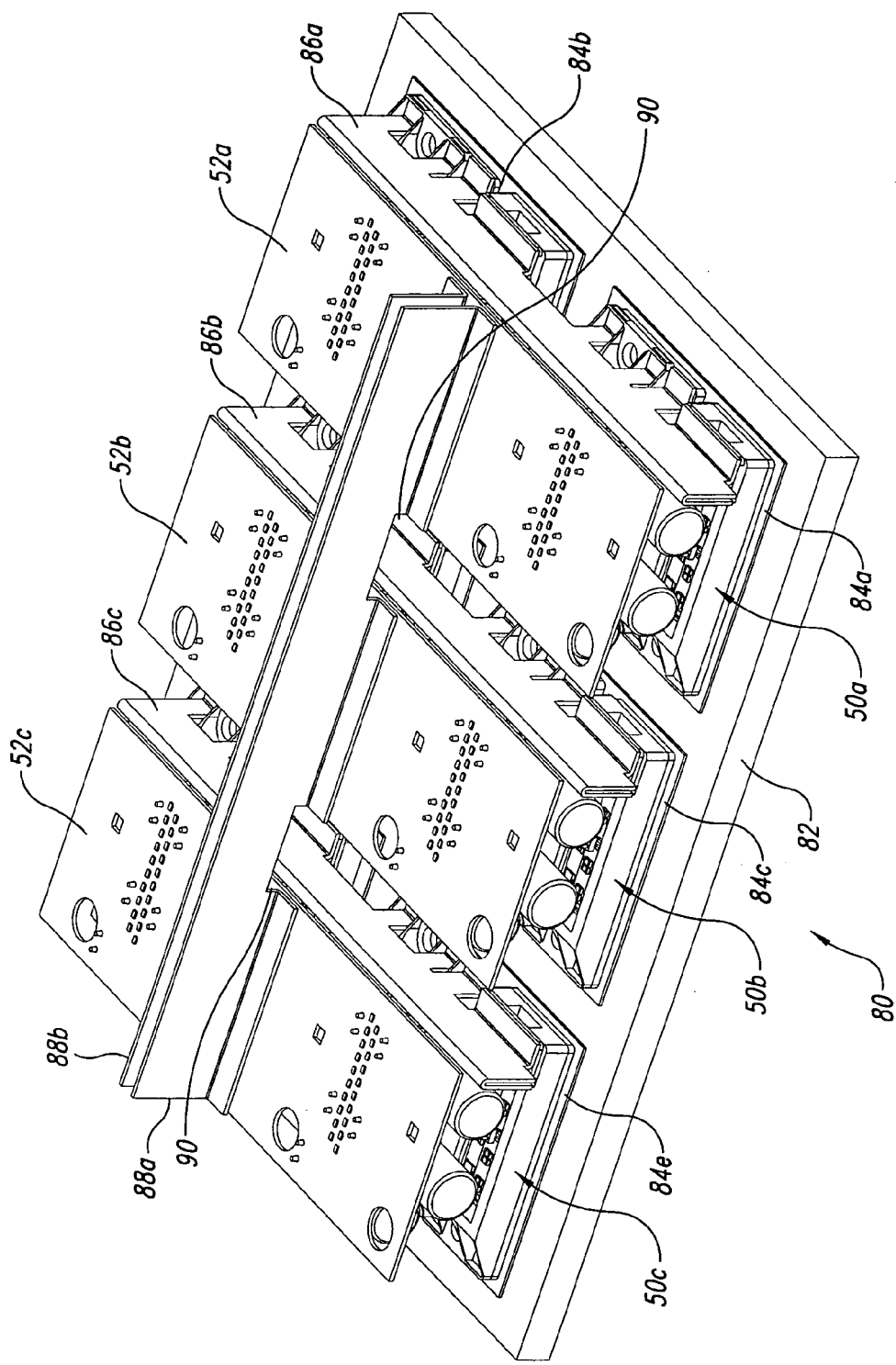
FIG. 11 is a top, rear, right isometric view of the three-phase inverter of FIG. 10.

FIGS. 10 and 11 show a three-phase inverter 80 formed from three of the half-bridge inverter modules 50 described above with reference to FIGS. 5-7 and/or FIG. 8 and denominated 50a-50c. The three-phase inverter 80 comprises a mounting plate 82, and six electrically nonconductive isolation pads 84a-84f carried on a surface of the mounting plate 82. The mounting plate 82 may be formed from a conductive material, for example, copper or aluminum. The isolation pads 84a-84f may take the form of a variety of electrically insulating materials, although those with a low thermal impedance may be preferred. For example, a suitable material for the isolation pads 84a-84f may be ISOSTRATE™, a polymide film with a phase change material on each opposed surface of the film to provide a high dielectric effect with a low thermal impedance, which is commercially available from Power Devices Inc. of Laguna Hills, Calif. Each isolation pad 84a-84f carries a pair of low- and high-side switch modules 10, 40.

While the isolation pads 84a-84f may be electrically insulative, and hence to some extent thermally insulative, the illustrated embodiment advantageously increases the surface area of the heat sink (e.g., base plates 12) before heat transported from the semiconductor devices 18 encounters a first interface (e.g., connection between base plates 12 and isolation pads 84a-84f) with an insulative (electrically and/or thermally) layer or structure (e.g., isolation pads 84a-84f). This approach enhances the ability to transport heat away from the semiconductor devices, increasing reliability and potentially reducing the amount of silicon required, and hence the cost.

Each of the half-bridge inverter modules 50a-50c of the three-phase inverter 80 comprises a respective one of the circuit boards 52, 68 previously discussed and denominated 52a-52c. Each of the half-bridge inverter modules 50a-50c of the three-phase inverter 80 comprises a respective phase terminal 86a-86c. The phase terminals 86a-86c may take the form of elongated conductors for example, elongated copper plates, bands or bars, with or without appropriate cutouts and folds or bends to accommodate the structure of the housings 14 of the switch modules 10, 40. The phase terminals 86a-86c may additionally or alternatively include a folded over portion to provide structural strength and/or to form an attachment structure for making external connections thereto. A portion, for example the folded over portion, may extend out of the housing 14 to facilitate external connections. The phase terminals 86a-86c may be soldered or otherwise fastened to the phase outputs of the low- and high-side switch modules 10, 40, respectively. For example, the phase terminals 86a-86c are electrically coupled to the base plate 12 of each of the low-side switch modules 10 and to the conductive member 16 of each of the high-side switch modules 40. The phase terminals 86a-86c and circuit boards 52a-52c may include aligned holes for receiving screws for mounting the phase terminals 86a-86c to the phase outputs of the low- and high-side switch modules 10, 40.

The three-phase inverter 80 may further comprise a pair of DC terminals 88a, 88b. The DC terminals 88a, 88b are commonly referred to as bus bars, but can take any variety of shapes and sizes. A dielectric may be received between the DC terminals 88a, 88b, to electrically isolate the DC terminals 88a, 88b from one another, and reduce or eliminate inductance. Some DC terminal structures are discussed in commonly assigned U.S. application Ser. No. 09/882,708, filed Jun. 15, 2001; U.S. application Ser. No. 09/957,568, filed Sep. 20, 2001; U.S. application Ser. No. 10/109,555, filed Mar. 27, 2002; and U.S. application Ser. No. 60/471,387, filed May 16, 2003. The DC terminals 88a, 88b may extend perpendicularly to the phase terminals 86a-86c, and may comprise cutouts 90 for accommodating the phase terminals 86a-86c without making electrical contact therewith. The DC terminals 88a, 88b may be soldered or otherwise fastened (e.g., screwed or bolted) to the DC inputs of the low- and high-side switch modules 10, 40. For example, a negative one of the DC terminals 88a, 88b may be coupled to the conductive member 16 of the low-side switch modules 10 via the circuit boards 52a-52c, and a positive one of the DC terminals 88a, 88b may be coupled to the base plate 12 or upright portion 26 of the high-side switch modules 40 via the circuit boards 52a-52c.

Figure 12:
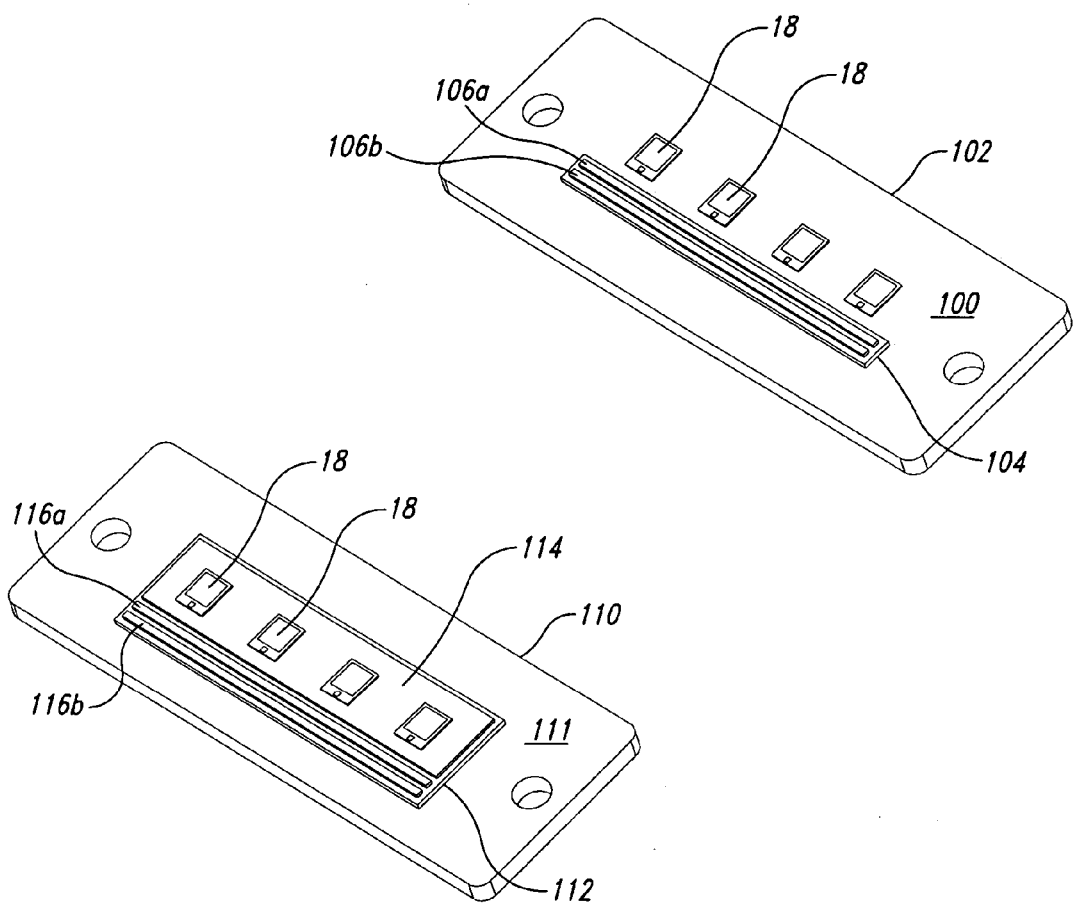
FIG. 12 is a top, right, front isometric view of a first conductive base substrate and associated structures suitable for use in a low-side switch module and a second conductive base substrate and associated structures suitable for use in a high-side switch module, according to one illustrated embodiment.

FIG. 12 shows a number of semiconductor devices 18 provided as unpackaged or bare dice each having an active terminal (e.g., collector, drain) electrically and thermally coupled to a surface 100 of a conductive base substrate 102 by surface mounting. The surface 100 of the conductive base substrate 102 also carries an insulative substrate 104. The insulative substrate 104 carries one or more conductive patterns 106a, 106b for routing control signals (e.g., gate drive signals) to the control terminals (e.g., gates, bases) of the semiconductor devices 18. The conductive base substrate 102 and associated structure are particularly suitable for use in a low-side switch module, as discussed in detail below.

FIG. 12 also shows a conductive base substrate 110. A surface 111 of the conductive base substrate 110 carries an insulative substrate 112. The insulative substrate 112 carries a conductive secondary substrate 114. The conductive secondary substrate 114 may, for example, take the form of a DBC substrate. The conductive secondary substrate 114 carries a number of semiconductor devices 18, provided as unpackaged or bare dice each having an active terminal (e.g., collector, drain) electrically and thermally coupled to the conductive secondary substrate 114 via surface mounting techniques. The insulative substrate 112 also carries one or more conductive patterns 116a, 116b for routing control signals (e.g., gate drive signals) to the control terminals (e.g., gates, bases) of the semiconductor devices 18. The conductive base substrate 110 and associated structure are particularly suitable for use in a high-side switch module, as discussed in detail below.

While the insulative substrate 112 may be electrically insulative, and hence to some extent thermally insulative, the illustrated embodiment advantageously increases the surface area of the heat sink (e.g., conductive base substrate 110) before heat transported from the semiconductor devices 18 encounters a first interface (e.g., connection between conductive base substrate 110 and insulative substrate 112) with an insulative (electrically and/or thermally) layer or structure (e.g., insulative substrate 112). This enhances the ability to transport heat away from the semiconductor devices, increasing reliability and potentially reducing the amount of silicon required, and hence the cost.

Figure 13:
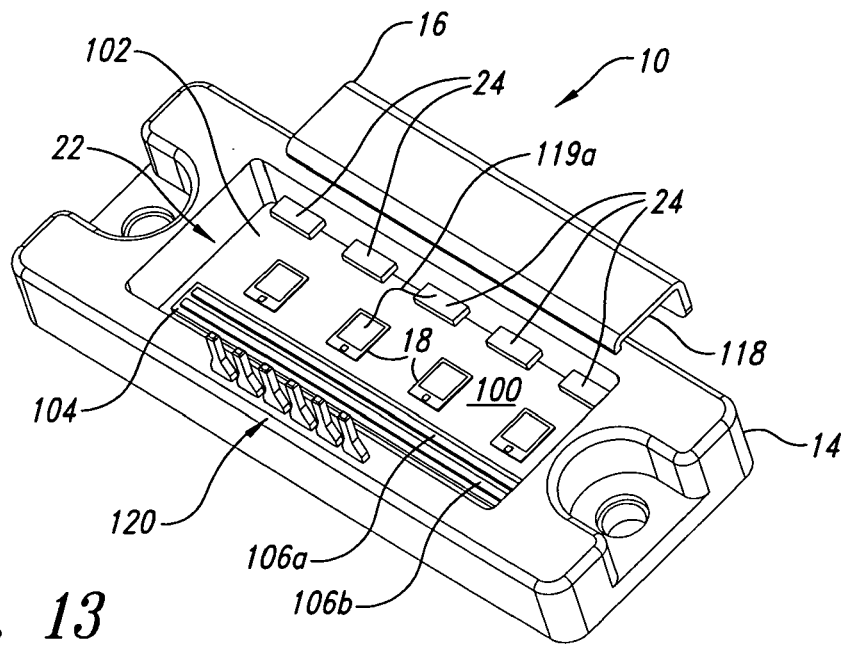
FIG. 13 is a top, right, front isometric view of a low-side switch module employing the first conductive base substrate of FIG. 12, according to one illustrated embodiment.

FIG. 13 shows a low-side switch module 10 according to one illustrated embodiment, employing the conductive base substrate 102 and associated structure of FIG. 12. As in the previous embodiments, the low-side switch module 10 includes a housing 14 forming an opening 22. A conductive member 16 is insert molded with the housing 14 and has a first portion 118 extending externally from the housing 14 and another (i.e., perimeter) portion 24 extending internally into the opening 22. The first portion 118 is bent or folded back on itself to extend spaced from and along a portion of the housing 14. The exposed (i.e., die side up) active terminals (e.g., source, emitter) of the semiconductor devices 18 are electrically coupled to the perimeter portion 24 of the conductive member 16 extending into the opening 22 via one or more wire bonds 119a (only one illustrated), for electrical coupling to a negative DC source, for example via a negative DC bus, discussed below). As discussed above, other active terminals (e.g., drain, collector) of the semiconductor devices 18 are surface mounted to the conductive base substrate 102 to electrically couple that active terminal to a phase output (illustrated in FIG. 15 and discussed below). The low-side switch module 10 may also include a number of gate pins or terminals 120 insert molded with the housing 14, and extending upward from the housing 14 for making external connections to a controller (not shown).

Figure 14:
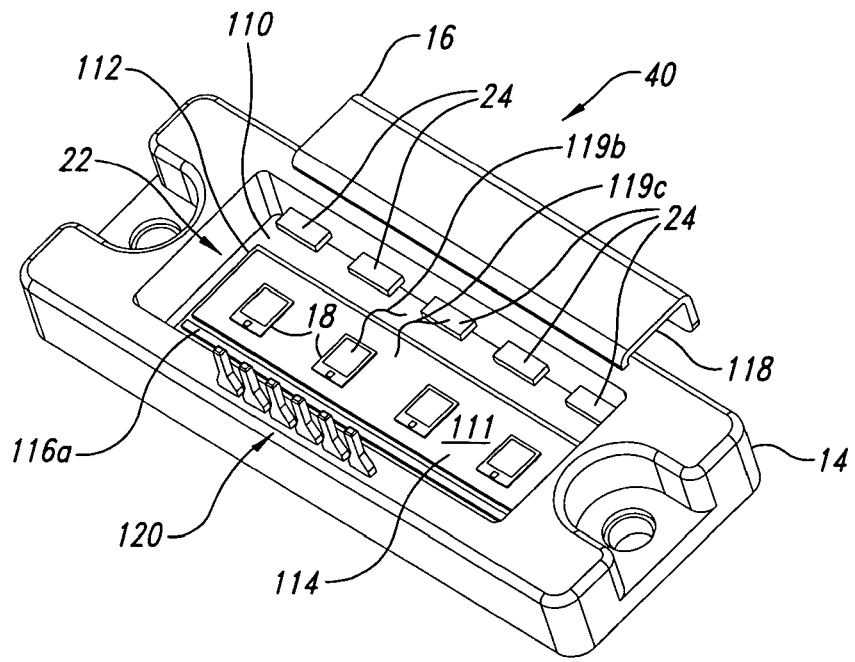
FIG. 14 is a top, right, front isometric view of a high-side switch module employing the second conductive base substrate of FIG. 12, according to one illustrated embodiment.

FIG. 14 shows a high-side switch module 40 according to one illustrated embodiment, employing the conductive base substrate 110 and associated structure of FIG. 12. As in the previous embodiments, the high-side switch module 40 includes a housing 14 forming an opening 22. A conductive member 16 is insert molded with the housing 14 and has a first portion 118 extending externally from the housing 14 and another (i.e., perimeter) portion 24 extending internally into the opening 22. The first portion 118 is bent or folded back on itself to extend spaced from and along a portion of the housing 14. The exposed (die side up) active terminals (e.g., source, emitter) of the semiconductor devices 18 are electrically coupled to the conductive base substrate 110 via one or more wire bonds 119*b* (only one illustrated), for electrically coupling the active terminal (e.g., source, emitter) of the semiconductor device 18 to a phase output (illustrated in FIG. 15 and discussed below). The conductive secondary substrate 114, to which semiconductor devices 18 are surface mounted, is electrically coupled to the perimeter portion 24 of the conductive member 16 extending into the opening 22 by one or more wire bonds 119*c* (only one illustrated), for electrically coupling the other active terminal (e.g., drain, collector) to a positive DC source, for example via a positive DC bus, discussed below. The high-side switch module 40 may also include a number of gate pins or terminals 120 insert molded with the housing 14, and extending upward from the housing 14 for making external connections to a controller (not shown).

Figure 15:
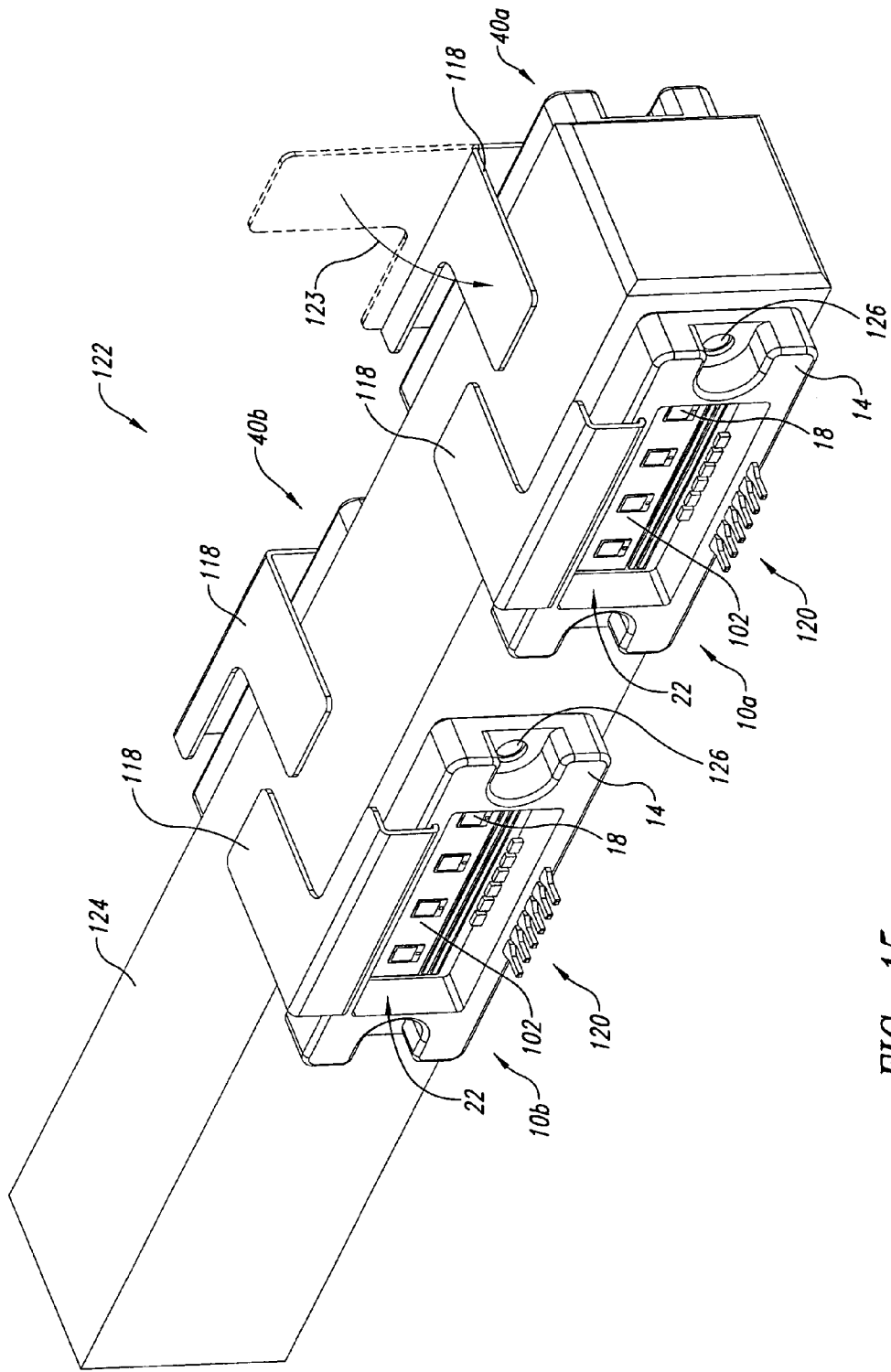
FIG. 15 is a top, right, front isometric view of a half-bridge module comprising a phase bar and two pairs of the low- and high-side switch modules of FIGS. 13 and 14, according to one illustrated embodiment.

FIG. 15 shows a half-bridge structure 122 according to one embodiment, formed using the low-and high-side switch modules 10, 40 of FIGS. 12-14. The half-bridge structure 122 comprises a phase bar 124 to which the conductive base substrates 102, 110 of pairs of low- and high-side switch modules 10*a*, 40*a*, 10*b*, 40*b* are physically and electrically coupled using solder or appropriate fasteners such as screws, bolts, or clamps (not shown) received through holes 126 formed in the conductive base substrates 102, 110. The phase bar 124 may be formed from a variety of conductive materials, for example, copper or aluminum, and may be formed by extrusion, molding, stamping or other suitable manufacturing operations. The first portion 118 of the conductive members 16 extending externally from the housing 14 of the pairs of low and high-side switch modules 10*a*, 40*a*, 10*b*, 40*b* folds over the phase bar 124 (illustrated by broken lines, and arrow 123), and is spaced from the phase bar 124, forming terminals for making electrical connections to the DC supply, for example via a DC bus.

Figure 16:
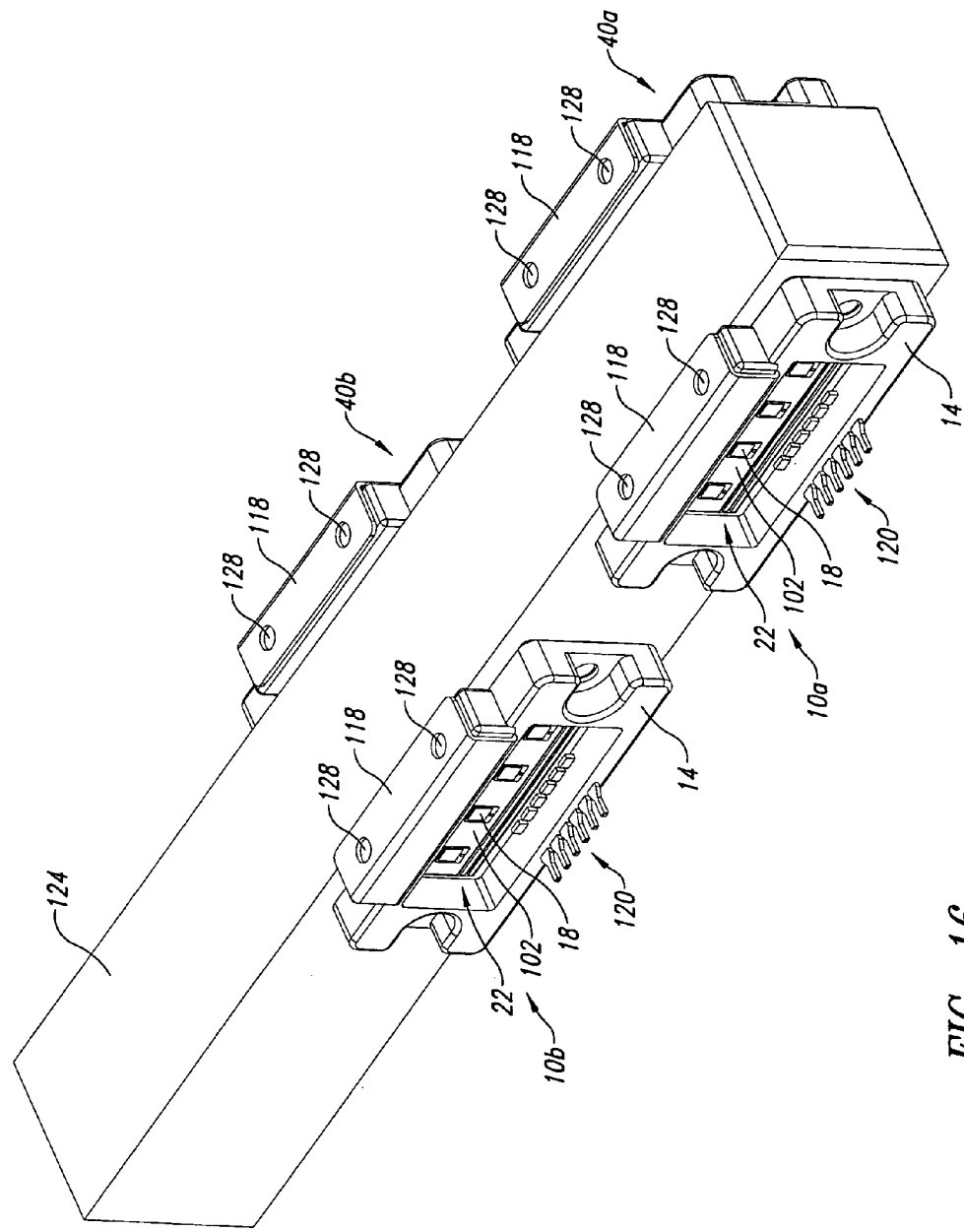
FIG. 16 is a top, right, front isometric view of a half-bridge module comprising a phase bar and two pairs of the low- and high-side switch modules similar to those of FIGS. 13 and 14, according to another illustrated embodiment.

FIG. 16 shows a half-bridge structure 122 according to another embodiment, employing switch modules 10, 40 similar to those of FIGS. 12-14. In this embodiment, the first portion 118 of the conductive members 16 extending externally from the housing 14 of each of the low- and high-side switch modules 10*a*, 40*a*, 10*b*, 40*b* are folded back toward, but not over, the phase bar 124, and include coupling structures such as holes 128, which may or may not may be threaded, for making electrical connections to the DC supply, for example via a DC bus.

Figure 17:
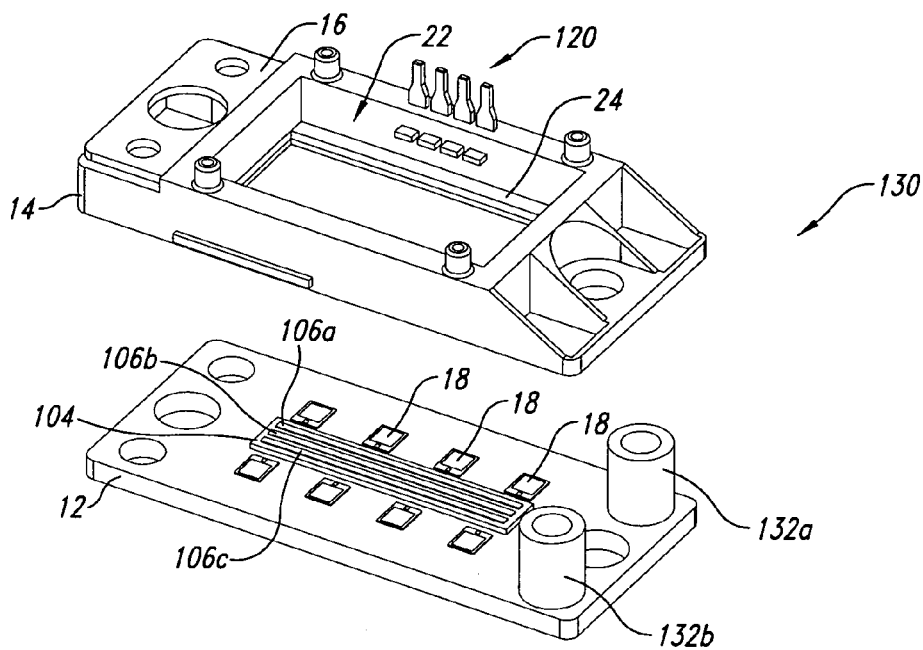
FIG. 17 is a top, rear, right isometric view of a switch module suitable for use as both a low- and high-side switch, according to one illustrated embodiment.

FIG. 17 shows a switch module 130 capable of use as both low-side and high-side switches. A number of the elements are identical or similar to those in previously described embodiments, so are designated with the same reference numerals as in those previously described embodiments. Only significant differences in structure are discussed below.

The switch module 130 comprises a conductive base plate 12 and an electrically insulative housing 14 coupled to the base plate 12 by way of adhesive and/or fasteners. The switch module 130 also includes a conductive member 16, insert molded in the housing 14. The conductive member 16 comprises a perimeter portion 24 extending internally from the housing into an opening 22 formed by the housing 14, and a portion extending externally from the housing 14 to which the lead line from the reference numeral 16 points.

The switch module 130 also comprises a number of semiconductor devices 18, preferably provided as unpackaged or bare dice. Each of semiconductor devices 18 comprises at least one active terminal (e.g., drain, collector) electrically and thermally coupled to the base plate 12, for example, via surface mounting techniques. The other active terminal (e.g., source, emitter) is electrically coupled to the perimeter portion 24 of the conductive member 16 via one or more wire bonds 28 (only one illustrated in FIG. 18).

The base plate 12 carries an insulative substrate 104, which in turn carries one or more conductive patterns 106*a*-106*c* for routing control signals (e.g., gate drive signals) to the control terminals of the semiconductor devices 18 from a controller (not shown). In particular, the control signals may be received at a set of gate pins or terminals 120, insert molded in the housing 14. The gate pins or terminals 120 may extend into the opening 22 of the housing 14, and may be electrically coupled to the conductive patterns 106*a*-106*c* via wire bonds 36 (only one illustrated in FIG. 18). The conductive patterns 106*a*-106*c* are electrically coupled to the control terminals of the semiconductor devices 18, for example via one or more wire bonds (not illustrated in FIG. 18). The insulative substrate 104 may comprise one or more layers, where at least one layer is electrically insulative. For example, the insulative substrate 104 may take the form of a DBC substrate.

The switch module 130 further comprises one or more power posts 132*a*, 132*b* electrically coupled to, and extending from, the base plate 12 for making electrically connections thereto. As will be explained in detail below, the power posts 132*a*, 132*b* and conductive member 16 serve as the terminals for making electrical connections to the positive and negative poles of the DC supply or bus, and for making electrical connections to the phase output to the AC load. The ability to switch the functions of the power posts 132*a*, 132*b* and conductive member 16, allows a single switch module 130 to be used for both low-side and high-side switching, reducing costs associated with design, manufacture, inventory, and distribution.

Figure 18:
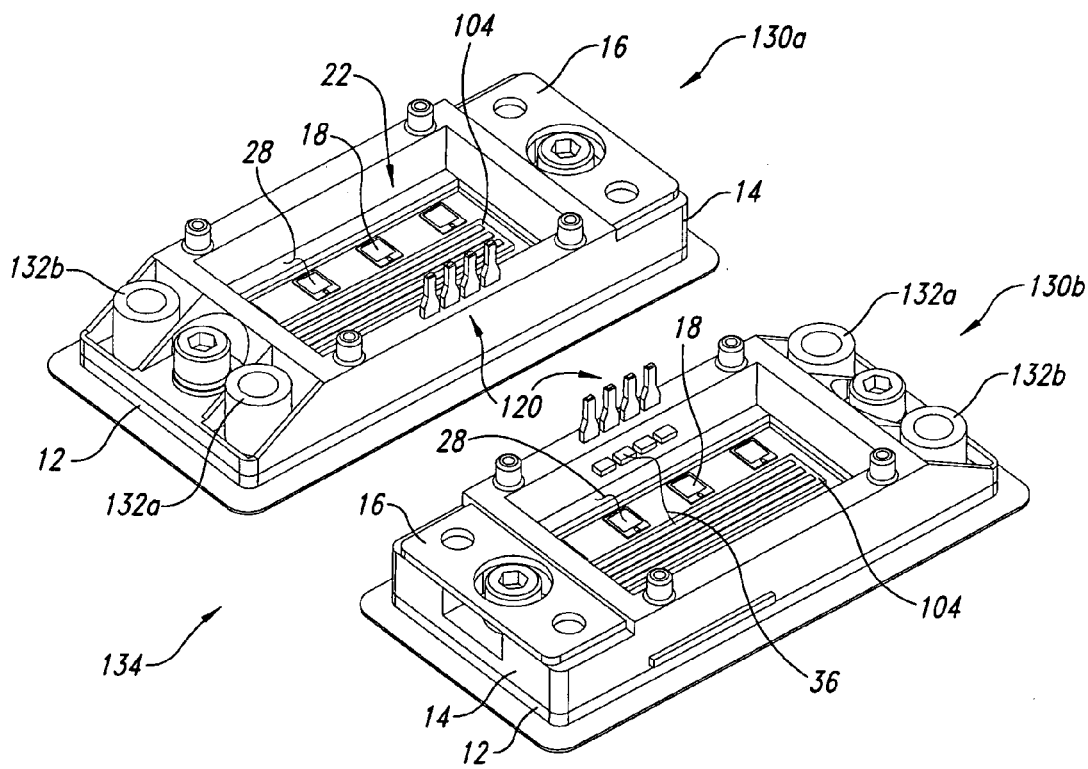
FIG. 18 is a top, front, right isometric view of a half-bridge module formed form two of the switch modules of FIG. 17, according to one illustrated embodiment.

FIG. 18 illustrates a half-bridge module 134 formed from two of the switch modules 130 of FIG. 17, a first switch module 130*a* that will serve as the low-side switch module, and a second switch module 130*b* that will serve as the high-side switch module. In particular, the switch modules 130*a*, 130*b* are oriented at 180 degrees with respect to one another to simplify electrical connections, although such orientation is not necessary. The power posts 132*a*, 132*b* of the second switch module 130*b* (i.e., high-side switch) are electrically coupled to the positive pole of the DC supply or bus. The conductive member 16 of the first switch module 130a (i.e., low-side switch) is electrically coupled to the negative pole of the DC supply or bus. The power posts 132a, 132b of the first switch module 130a (i.e., low-side switch) and the conductive terminal 16 of the second switch module 130b (i.e., high-side switch) each provide the AC phase output.

Figure 19:
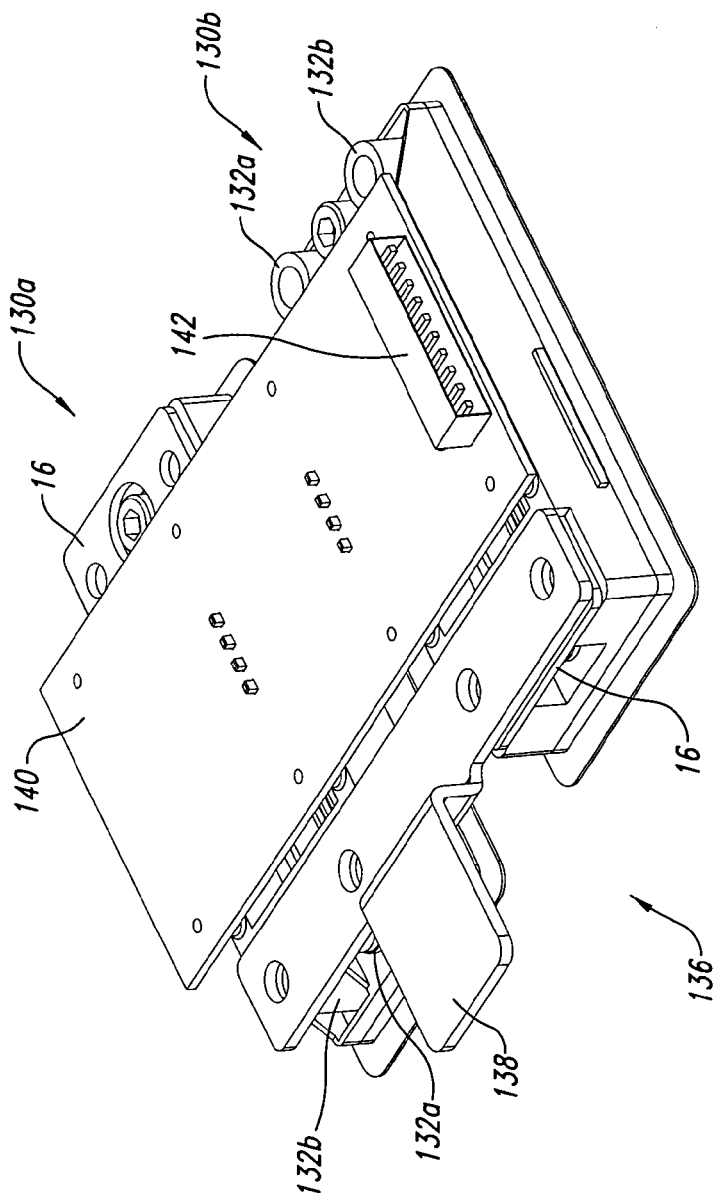
FIG. 19 is a top, front, right isometric view of a single phase half-bridge inverter formed by the half-bridge module of FIG. 18, according to one illustrated embodiment.

FIG. 19 shows a single phase half-bridge inverter 136 formed by the half-bridge module 134 of FIG. 18. A conductive phase terminal 138 electrically couples power posts 132a, 132b of the first switch module 130a (i.e., low-side switch) and the conductive terminal 16 of the second switch module 130b (i.e., high-side switch) to provide the AC phase output. The single phase half-bridge inverter 136 may include a sub-controller, such as a gate drive board 140. The gate drive board 140 may be mounted across the low- and high-side switch modules 130a, 130b. The gate pins 120 may be electrically coupled to the gate drive board 140. For example, gate pins 120 may be received in throughholes formed in the gate drive board 140, and electrically coupled thereto via a solder reflow process. The gate drive board 140 may include a connector 142 to couple to a controller or control board (not shown).

Figure 20:
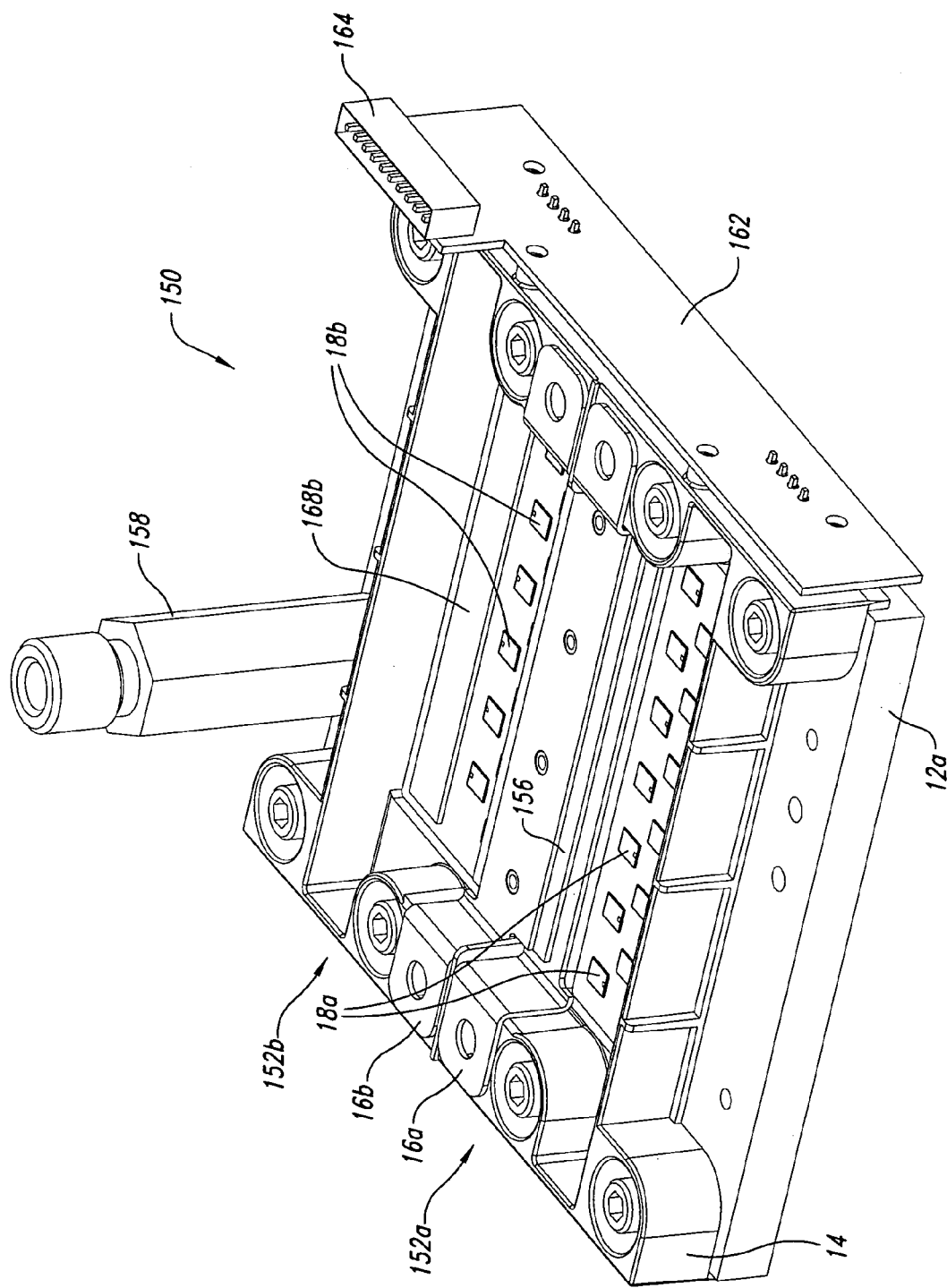
FIG. 20 is a top, front, left isometric view of a half-bridge module, according to one illustrated embodiment, where a single housing receives two switch modules.
Figure 21:
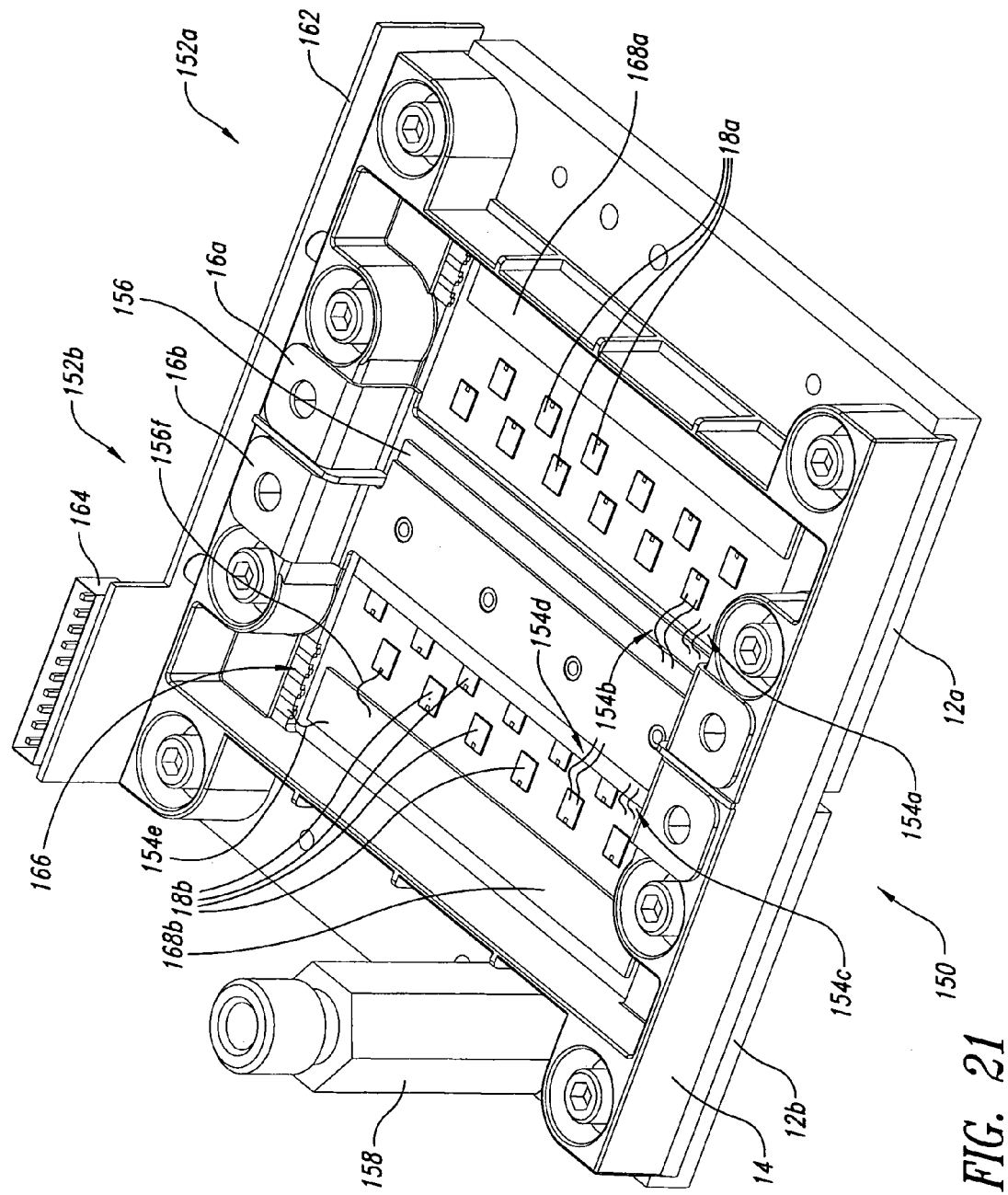
FIG. 21 is a top, rear, left isometric view of the half-bridge module of FIG. 20.
Figure 22:
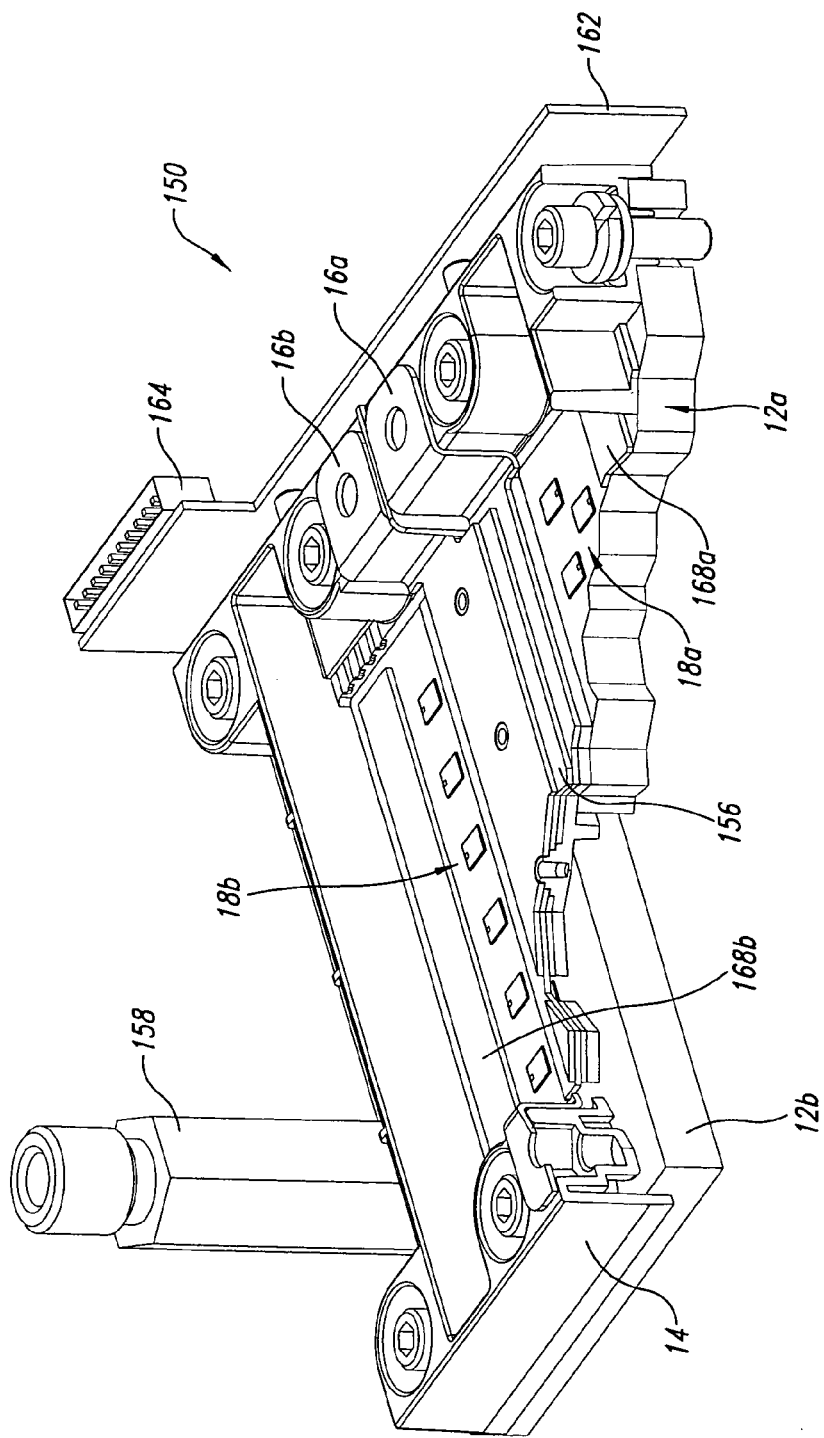
FIG. 22 is a partially broken top, left, rear, isometric view of the half-bridge module of FIGS. 20 and 21.

FIGS. 20-22 show a half-bridge inverter module 150 formed by first and second switch modules 152a, 152b according to another illustrated embodiment. In contrast to previous embodiments, the half bridge inverter module 150 comprises a single housing 14 that receives first and second switch modules 152a, 152b. The housing 14 comprises a skirt or rib that at least partially extends between the base plates 12a, 12b of the switch modules 152a, 152b, respectively. An active terminal (e.g., drain, collector) of each of a first set of semiconductor devices 18a (only a few called out in the Figures) is electrically and thermally coupled to the base plate 12a, for example via surface mounting techniques. Likewise, an active terminal (e.g., drain, collector) of each of a second set of semiconductor devices 18b is electrically and thermally coupled to the base plate 12b, for example via surface mounting techniques.

The housing 14 supports a first conductive member 16a and a second conductive member 16b, for electrically coupling to the positive and negative poles, respectively, of the DC supply or bus (not shown). The conductive members 16a, 16b may take a variety of forms, for example, copper or aluminum bars or strips, and may be formed by stamping, extrusion, rolling, molding or other various manufacturing operations. The first and second conductive members 16a, 16b may be electrically isolated from one another by an insulative member (not illustrated), such as Nomex™.

Figure 23:
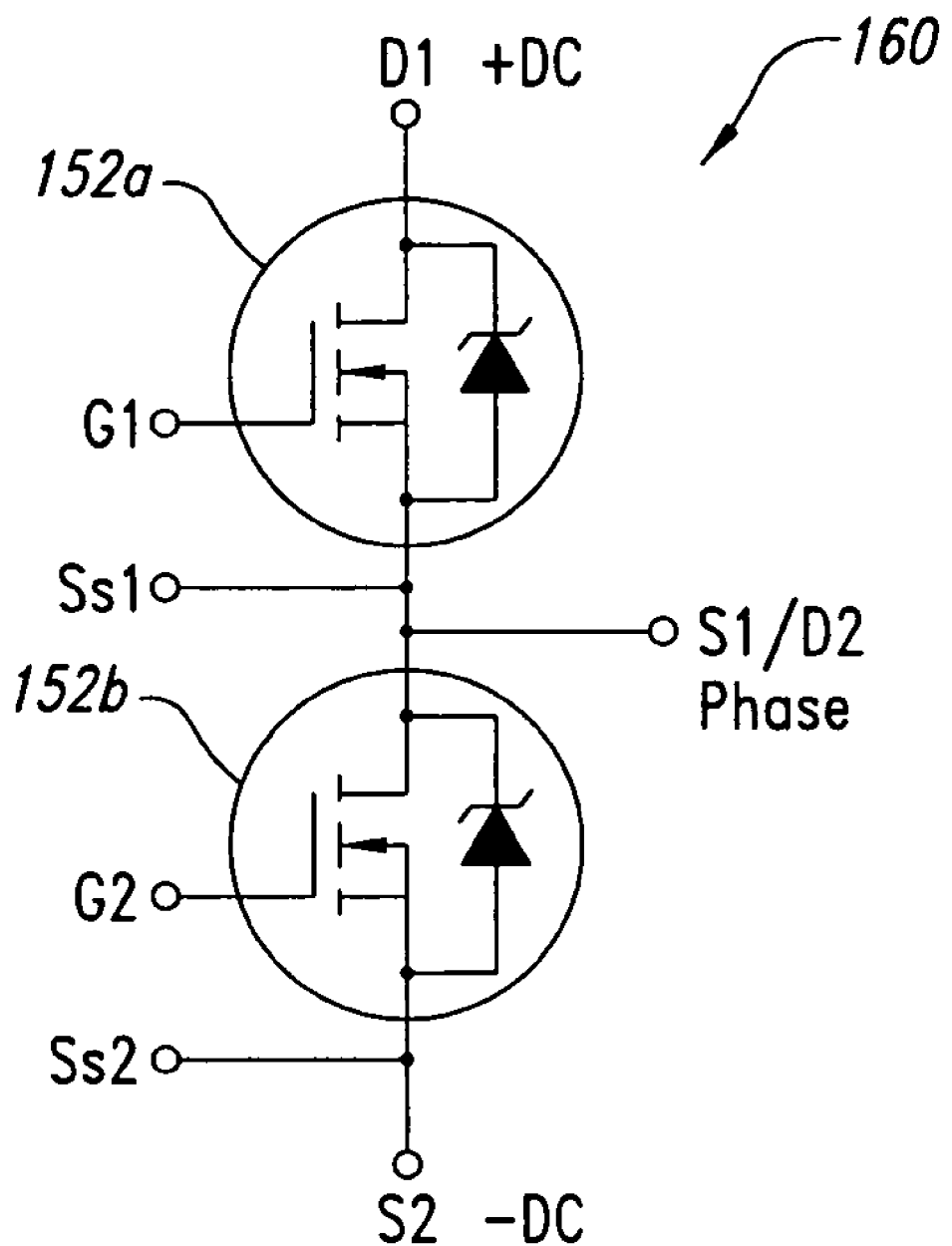
FIG. 23 is an electrical schematic diagram of a circuit formed by the half-bridge modules of FIGS. 20-22

The positive conductive member 16a is electrically coupled to the base plate 12a via one or more wire bonds 154a (only two illustrated, FIG. 21) to electrically couple one active terminal (e.g., drain, collector) of the semiconductor devices 18a to the positive pole of the DC supply or bus. The other active terminal (e.g., source, emitter) of each of the semiconductor devices 18a is electrically coupled to a conductive interconnect 156 via one or more wire bonds 154b (only two illustrated, FIG. 21). The conductive interconnect 156 may be formed from any of a variety of conductive materials, for example, copper or aluminum. The conductive interconnect 156 is electrically coupled to one active terminal (e.g., drain, collector) of the semiconductor devices 12b via the base plate 12b and one or more wire bonds 154c (only two illustrated, FIG. 21). The other active terminal (e.g., source, emitter) of each of the semiconductor devices 12b is electrically coupled to the second conductive member 16b via one or more wire bonds 154d (only two illustrated, FIG. 21). A phase terminal 158 is electrically coupled to the base plate 12b to provide the AC phase output. The phase terminal 158 may comprise a coupling structure to facilitate electrical connections to AC loads (not shown). The above described electrical coupling forms a half-bridge circuit 160, which is schematically illustrated in FIG. 23.

Returning to FIGS. 20-22, a control board 162 is physically coupled to the housing 14, and comprises a connector 164 for connecting to a controller (not shown) to receive control signals therefrom for driving the semiconductor devices 18a, 18b. Sets of control pins 166, insert molded in the housing 14, couple signals from the control board 162 to the via one or more wire bonds 154e (only one illustrated, FIG. 21). Insulating substrates 168a, 168b carried by the base plates 12a, 12b, carry conductive patterns (not shown in these Figures) to electrically coupled the control signals to the control terminals (e.g., gate, base) of the semiconductor devices 18 via one or more wire bonds 154f (only one illustrated, FIG. 21).

The control board 162 may comprises various discrete and/or integrated or solid state electrical and electronic components. For example, the control board 162 may comprise a microprocessor, application specific integrated circuit (ASIC), or digital signal processor (DSP) configured and/or programmed to produce gate drive signals to selectively activate the semiconductor devices 18a, 18b to invert a DC supply current into an AC output current. The control board 162 may include various sensors, for example, current sensor(s), temperature sensor(s), and/or voltage sensor(s) for detecting 1) magnitude of the input current; the magnitude, frequency and phase of the output current; and/or temperature of various semiconductor devices 18a, 18b, substrates, or ambient environments. Further, the control systems may be configured to use the various measurements to control the operation of the half-bridge inverter module 150, for example, controlling the speed, duration or order of switching signals supplied to the semiconductor devices 18a, 18b, or to shut down the half-bridge inverter module 150 upon occurrence or absence of certain conditions.

Figure 24:
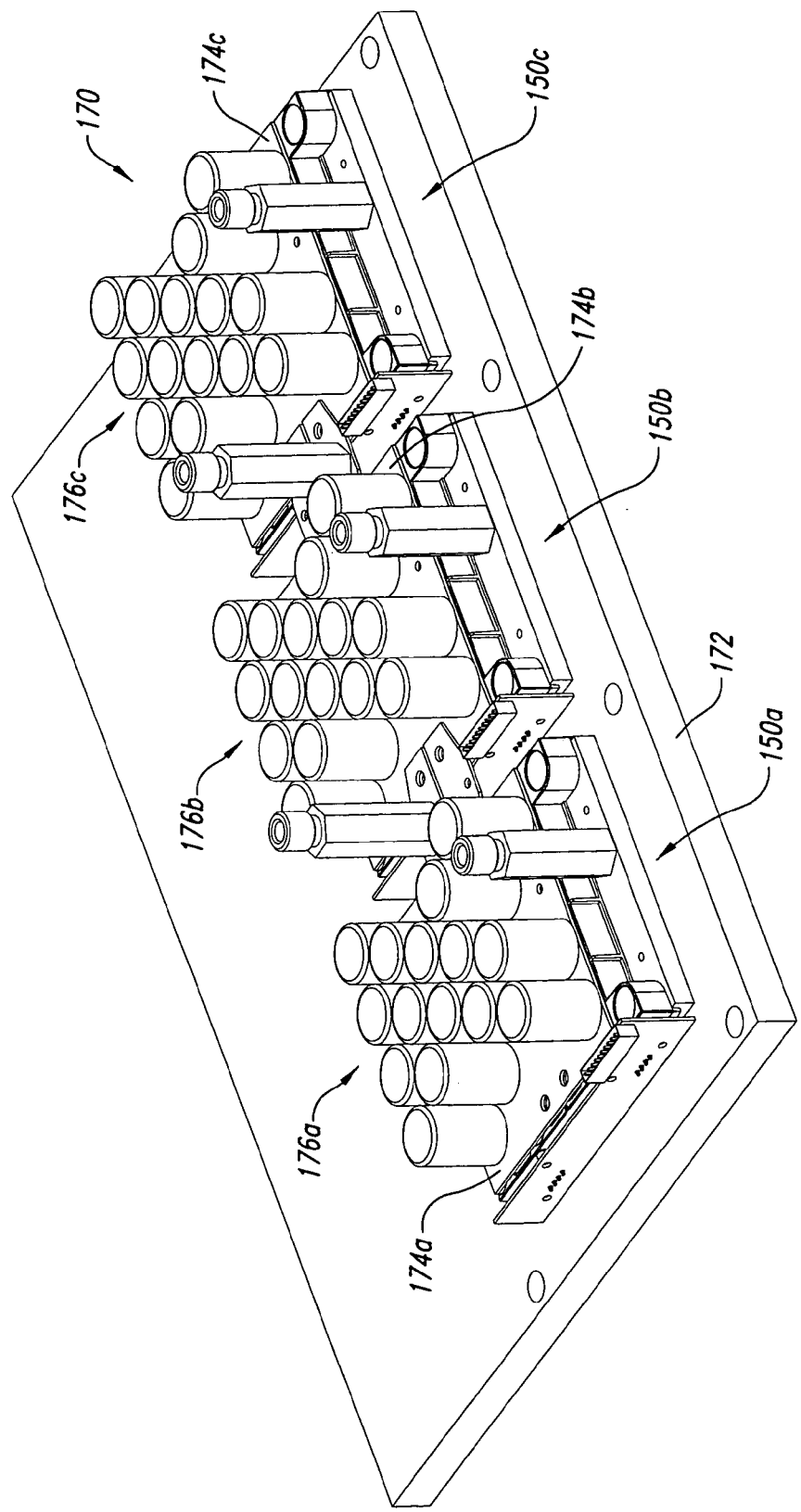
FIG. 24 is a top, front, left isometric view of a three-phase inverter formed by three of the half-bridge module of FIGS. 20-21.

FIG. 24 shows a three-phase inverter 170 comprising three of the half-bridge inverter modules of FIGS. 20-22, denominated 150a-150c. The base plates 12a-12c of the inverter modules 150a-150c are carried by a support member 172. The inverter modules 150a-150c may be secured to the support member 172 using fasteners, for example, screws, bolts or clamps.

The support member 172 is preferable thermally conductive, and may, for example, take the form of a cooling header. The cooling header may include one or more heat exchange loops comprising, for example, a heat transfer medium which may take a variety of forms of fluid, for example, a liquid, gas, or a fluid that changes phase as the fluid circulates through different portions of the heat exchange loop. The gas may, for example, take the form of air. The circulation may be passive or active, for example relying on a pump, compressor or fan (not shown) to actively circulate the heat transfer medium.

Where the support member 172 is thermally conductive it may also be electrically conductive. In such situations, an isolation pad (not shown in FIG. 23) underlies each of the inverter modules 150a-150c to prevent shorting between the phase outputs of the inverter modules 150a-150c. While the isolation pads may be somewhat thermally insulative, the illustrated embodiment advantageously increases the surface area of the heat sink (e.g., base plates 12a-12c) before heat transported from the semiconductor devices 18 encounters a first interface (e.g., connection between base plates 12a-12c and isolation pads) with an electrically and/or thermally insulative layer or structure (e.g., isolation pads).

Each of the inverter modules 150a-150c may be physically and electrically coupled to a respective circuit board 174a-174c, carrying a set of capacitors 176a-176c for reducing inductance.

The three-phase inverter 170 provides a compact design capable of handling substantial loads, while benefiting from modularization (e.g., reduced costs associated with design, manufacture, and distribution), and while providing enhanced reliability associated with good thermal management.

Although specific embodiments of and examples for the switch modules, converters and inverters and methods of manufacturing and operating the same are described herein for illustrative purposes, various equivalent modifications can be made without departing from the spirit and scope of the invention, as will be recognized by those skilled in the relevant art. The teachings provided herein of the invention can be applied to other converters and power modules, not necessarily the exemplary inverter power module generally described above.

While elements may be described herein and in the claims as "positive" or "negative" such denomination is relative and not absolute. Thus, an element described as "positive" is shaped, positioned and/or electrically coupled to be at a higher relative potential than elements described as "negative" when the element is coupled to a power source. "Positive" elements are typically intended to be coupled to a positive terminal of a power source, while "negative" elements are intended to be coupled to a negative terminal or ground of the power source. Generally, "positive" elements are located or coupled to the high-side of the power module and "negative" elements are located or coupled to the low-side of the power module.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to: Ser. Nos. 60/233,992; 60/233,993; 60/233,994; 60/233,995 and 60/233,996, each filed Sep. 20, 2000; Ser. Nos. 09/882,708 and 09/957,047, both filed Jun. 15, 2001; Ser. Nos. 09/957,568 and 09/957,001, both filed Sep. 20, 2001; Ser. No. 10/109,555, filed Mar. 27, 2002; Ser. No. 60/471,387, filed May 16, 2003; and Ser. No. 10/738,926, filed Dec. 16, 2003, and entitled "POWER MODULE WITH HEAT EXCHANGE" (Express Mail No. EV336618969US), are incorporated herein by reference, in their entirety. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all power converters and/or power modules in accordance with the claims. Accordingly, the invention is not limited by the disclosure, but instead its scope is to be determined entirely by the following claims.

We claim:

1. A power converter, comprising:
   a first phase terminal; and
   at least two switch modules, each of the switch modules comprising:
      a housing forming an interior compartment;
      a conductive base plate;
      a number of switches, each of the switches comprising a first active terminal, a second active terminal, and a control terminal, the first active terminals surface mounted to the conductive base plate;
      a conductive member supported by the housing, the conductive member comprising at least one portion extending externally from the housing and at least one portion extending internally in the interior compartment of the housing; and
      a number of wire bonds electrically coupling the second active terminal of the switches to the portion of the conductive member that extends internally in the interior compartment of the housing;
   wherein the conductive base plate of a first one of the switch modules comprises an upright portion extending at an approximately right angle with respect to the respective conductive base plate, and the conductive member of a second one of the switch modules comprises an upright portion extending at an approximately right angle with respect to the respective conductive base plate, and wherein the upright portions of the first and the second ones of the switch modules are parallel to each other and are electrically connected to the first phase terminal.

2. The power converter of claim 1 wherein the housings of the first and the second ones of the switch modules are identical in shape.

3. The power converter of claim 1 wherein each of the switch modules further comprises:
   an insulating substrate carried by the conductive base plate;
   a conductive pattern carried by the insulating substrate, the insulating substrate electrically insulating the conductive pattern from the conductive base plate;
   a number of resistors electrically coupled to the conductive pattern;
   a terminal block comprising a number of terminals electrically coupled to the conductive pattern; and
   a number of wire bonds electrically coupling the control terminals of the switches to the conductive pattern.

4. The power converter of claim 1 wherein the insulating substrate is centered in the interior compartment and the switches are arranged in two rows, one row on each of a pair of opposed sides of the insulating substrate.

5. The power converter of claim 1 wherein the portion of the conductive member extending externally from the housing is located proximate a first end of the housing, and wherein a portion of the conductive base plate is exposed at a second end of the housing, the second end of the housing opposite from the first end of the housing.

6. The power converter of claim 1 wherein the first phase terminal comprises an elongated metal structure, and further comprising:
   a positive DC terminal which is elongated; and
   a negative DC terminal which is elongated, the negative DC terminal closely spaced from and approximately parallel to the positive DC terminal, the positive and negative DC terminals approximately perpendicular to the first phase terminal.

7. The power converter of claim 1, further comprising:
at least two additional pairs of switch modules, a conductive base plate of a first one of the switch modules of each of the additional pairs comprising an upright portion extending at an approximately right angle with respect to the respective conductive base plate and a conductive member of a second one of the switch modules of each of the additional pairs comprising an upright portion extending at an approximately right angle with respect to the respective conductive base plate;
a second phase terminal electrically coupled to the first and second switch modules of one of the additional pairs of switch modules; and
a third phase terminal electrically coupled to the first and the second switch modules of another one of the additional pairs of switch modules.

8. A power converter, comprising:
at least a first switch module comprising:
a first housing of an electrically insulative material forming an interior and an exterior, the interior of the first housing open to the exterior at a first end and at a second end;
a first conductive base plate comprising a first surface and a second surface opposed to the first surface;
a first number of semiconductor switches each comprising a first active terminal, a second active terminal and a control terminal, the first active terminal of each of the first number of semiconductor switches surface mounted to the first surface of the first conductive base plate wherein the first conductive base plate is coupled to the first housing such that the first conductive base plate closes the opening at the second end of the first housing with the first number of semiconductor switches disposed in the interior of the first housing and the second surface of the first conductive base plate is exposed to the exterior of the first housing to transfer heat from the first housing;
a first conductive member supported by the first housing, the first conductive member comprising an exterior portion extending from the first housing into the exterior, a perimeter portion forming at least one shelf extending from the first housing into the interior of the first housing, and an upright portion extending upright with respect to the first surface of the first conductive base plate from the first housing into the exterior; and
a number of wire bonds electrically coupling the second active terminal of each of the first number of semiconductor switches to the shelf of the first conductive member;
at least a second switch module comprising:
a second housing of an electrically insulative material forming an interior and an exterior, the interior of the second housing open to the exterior at a first end and at a second end;
a second conductive base plate comprising a first surface, a second surface opposed to the first surface, and an upright portion extending upright with respect to the first surface of the second conductive base plate from the second housing into the exterior;
a second number of semiconductor switches each comprising a first active terminal, a second active terminal and a control terminal, the first active terminal of each of the second number of semiconductor switches surface mounted to the first surface of the second conductive base plate wherein the second conductive base plate is coupled to the second housing such that the second conductive base plate closes the opening at the second end of the second housing with the second number of semiconductor switches disposed in the interior of the second housing and the second surface of the second conductive base plate is exposed to the exterior of the second housing to transfer heat from the second housing;
a second conductive member supported by the second housing, the second conductive member comprising an exterior portion extending from the second housing into the exterior and a perimeter portion forming at least one shelf extending from the second housing into the interior of the second housing; and
a number of wire bonds electrically coupling the second active terminal of each of the second number of semiconductor switches to the shelf of the second conductive member; and
a first terminal, wherein the first conductive base plate of the first switch module and the second conductive member of the second switch module are electrically coupled to the first terminal.

9. The power converter of claim 8 wherein the second housing has a shape identical to a shape of the first housing.

10. The power converter of claim 8 wherein the first switch module further comprises:
a first insulating substrate carried by the first surface of the first conductive base plate;
a conductive pattern carried by the first insulating substrate, the first insulating substrate electrically insulating the conductive pattern from the first conductive base plate;
a number of resistors electrically coupled to the conductive pattern;
a terminal block comprising a number of terminals electrically coupled to the conductive pattern; and
a number of wire bonds electrically coupling the control terminals of the first number of semiconductor switches to the conductive pattern.

11. The power converter of claim 10 wherein the second switch module further comprises:
a second insulating substrate carried by the second surface of the second conductive base plate;
a conductive pattern carried by the second insulating substrate, the second insulating substrate electrically insulating the conductive pattern from the second conductive base plate;
a number of resistors electrically coupled to the conductive pattern;
a terminal block comprising a number of terminals electrically coupled to the conductive pattern; and
a number of wire bonds electrically coupling the control terminals of the second number of semiconductor switches to the conductive pattern.

12. The power converter of claim 8 wherein the upright portions of the conductive base plate and the conductive member each comprise a number of fingers formed at a distal end thereof, and further comprising:
a circuit board comprising at least one conductive trace electrically coupled to at least one of the number of fingers of at least one of the upright portions.

13. The power converter of claim 12, further comprising:
a number of capacitors carried by the circuit board and electrically coupled to at least one of the upright portions by the at least one conductive trace.

14. The power converter of claim 8 wherein a single phase of the power converter includes the first switch module, the second switch module, a third switch module and a fourth switch module.

15. The power converter of claim 8 wherein the first surface of the first conductive base plate is thermally coupled to the second surface of the first conductive base plate without an intervening thermally resistive material.

16. The power converter of claim 8 wherein the first conductive base plate consists of a plate of a metal.

17. The power converter of claim 8 wherein the first terminal is elongated, and further comprising:
 a second terminal which is elongated; and
 a third terminal which is elongated, the third terminal approximately parallel to the second terminal and approximately perpendicular to the first terminal.

18. The power converter of claim 17, further comprising:
 a mounting plate formed from an electrically and thermally conductive material; and
 a number of electrically non-conductive isolation pads electrically isolating the first and second conductive base plates from the mounting plate.

19. The power converter of claim 8 wherein the first insulating substrate and the first conductive pattern comprise two layers of either a direct bond copper substrate or a direct bond aluminum substrate.

20. The power converter of claim 8 wherein the first number of semiconductor switches comprises unpackaged bare silicon die transistors.

* * * * *